US012754162B2

(12) United States Patent
Park et al.

(10) Patent No.: US 12,754,162 B2
(45) Date of Patent: Oct. 6, 2026

(54) BIOSENSOR BASED ON METAL OXIDE THIN FILM TRANSISTOR AND MANUFACTURING METHOD FOR THE SAME

(71) Applicant: AJOU UNIVERSITY INDUSTRY-ACADEMIC COOPERATION FOUNDATION, Suwon-si (KR)

(72) Inventors: Sungjun Park, Yongin-si (KR); Chuljin Hwang, Seongnam-si (KR); Seokhyeon Baek, Suwon-si (KR); Wonsik Kim, Suwon-si (KR); Na Yeon Joo, Seoul (KR); SungHoon Kim, Seoul (KR)

(73) Assignee: AJOU UNIVERSITY INDUSTRY-ACADEMIC COOPERATION FOUNDATION, Suwon-si (KR)

( * ) Notice: Subject to any disclaimer, the term of this patent is extended or adjusted under 35 U.S.C. 154(b) by 376 days.

(21) Appl. No.: 18/399,946

(22) Filed: Dec. 29, 2023

(65) Prior Publication Data

US 2024/0219342 A1 Jul. 4, 2024

(30) Foreign Application Priority Data

Dec. 29, 2022 (KR) ........................ 10-2022-0188852
Dec. 15, 2023 (KR) ........................ 10-2023-0183293

(51) Int. Cl.
*G01N 27/414* (2006.01)
*H10D 30/67* (2025.01)

(52) U.S. Cl.
CPC ..... *G01N 27/4145* (2013.01); *G01N 27/4146* (2013.01); *H10D 30/6755* (2025.01); *H10D 30/6756* (2025.01)

(58) Field of Classification Search
CPC ........... H10D 30/6755; H10D 30/6756; G01N 27/4145; G01N 27/4146
See application file for complete search history.

(56) References Cited

U.S. PATENT DOCUMENTS

2004/0238379 A1* 12/2004 Lindsay ............. G01N 27/4145 205/792

FOREIGN PATENT DOCUMENTS

KR 10-1375590 B1 3/2014
KR 20220078168 A * 6/2022 ............. H10D 99/00
KR 10-2022-0141741 A 10/2022

OTHER PUBLICATIONS

Keun Woo Lee et al., "Thin film transistors by solution-based indium gallium zinc oxide/carbon nanotubes blend," Thin Solid Films 517 (2009) 4011-4014. (Year: 2009).*

* cited by examiner

*Primary Examiner* — Peter M Albrecht
(74) *Attorney, Agent, or Firm* — NKL LAW; Jae Youn Kim

(57) ABSTRACT

Provided is a semiconductor-based DNA sensor which includes: a first electrode and a second electrode disposed on a substrate to be spaced apart from each other; a channel layer disposed between the first electrode and the second electrode; a target coupling layer disposed on the channel layer, and including probe DNA detecting target DNA through a hybridization reaction; a passivation layer selectively exposing an upper portion of the target coupling layer; and a gate layer disposed at a lower portion and/or an upper portion of the substrate, or an upper portion of the target coupling layer, in which the channel layer includes a metal oxide and a carbon nano tube.

13 Claims, 17 Drawing Sheets

[Fig. 3]
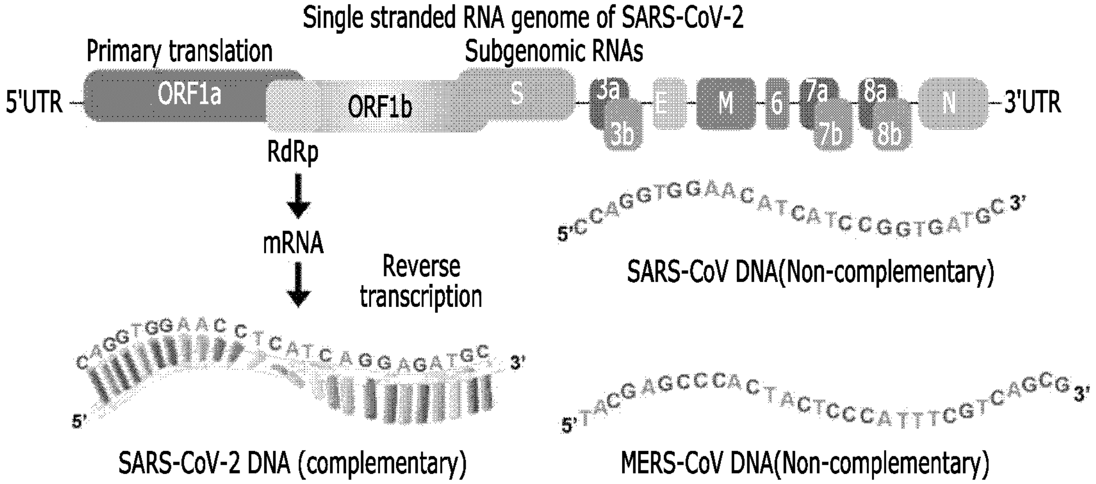
[Fig. 4]
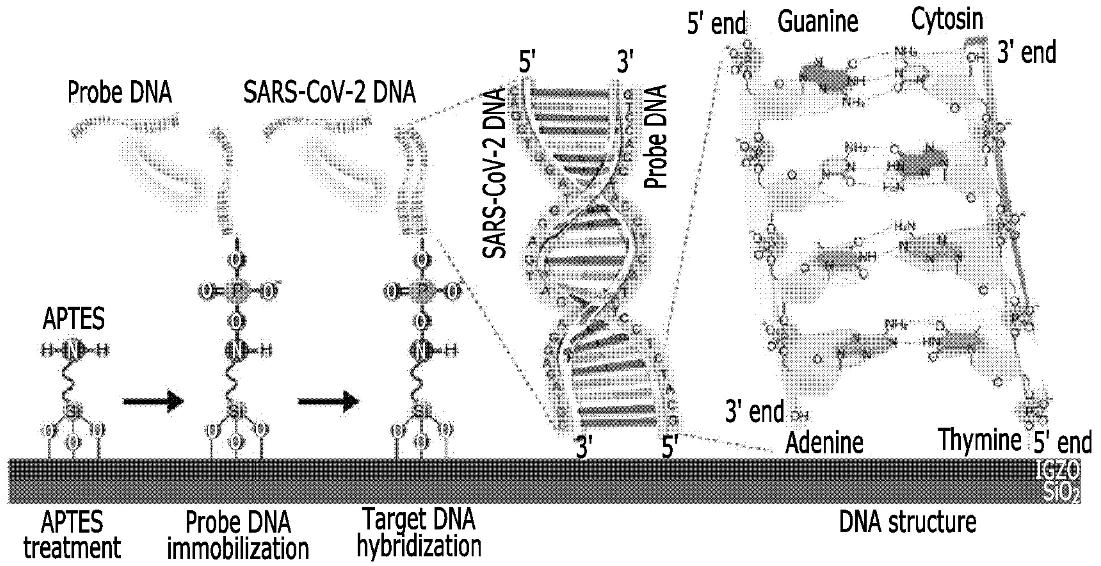

[Fig. 5]
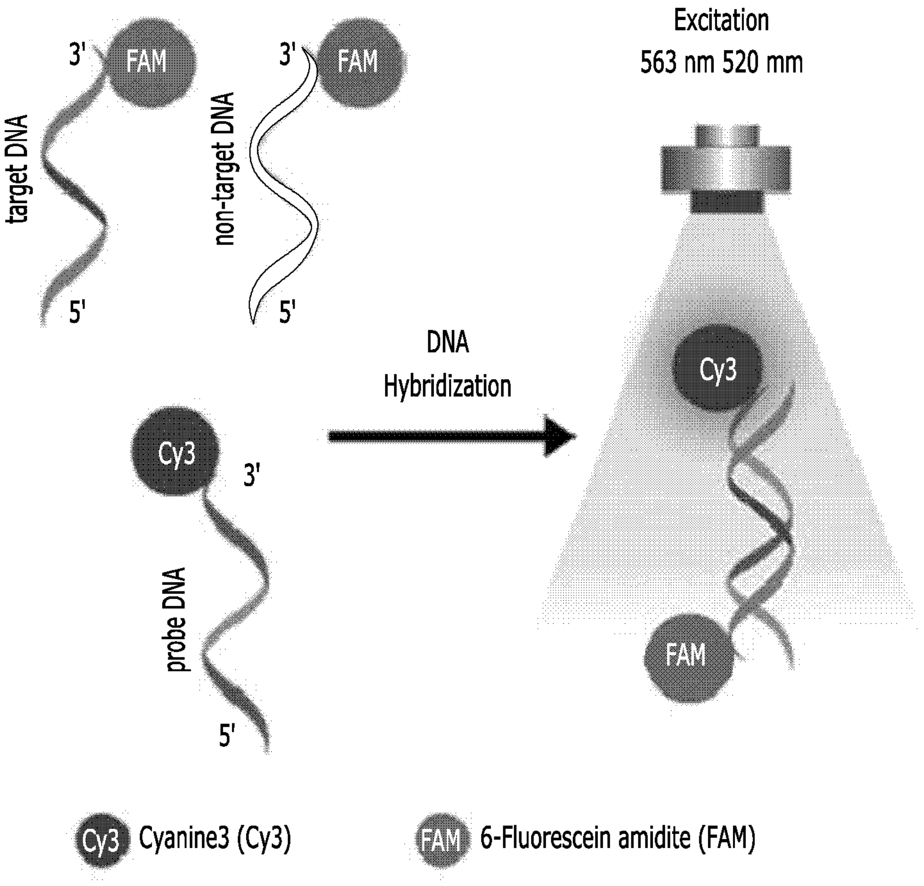
[Fig. 6a]
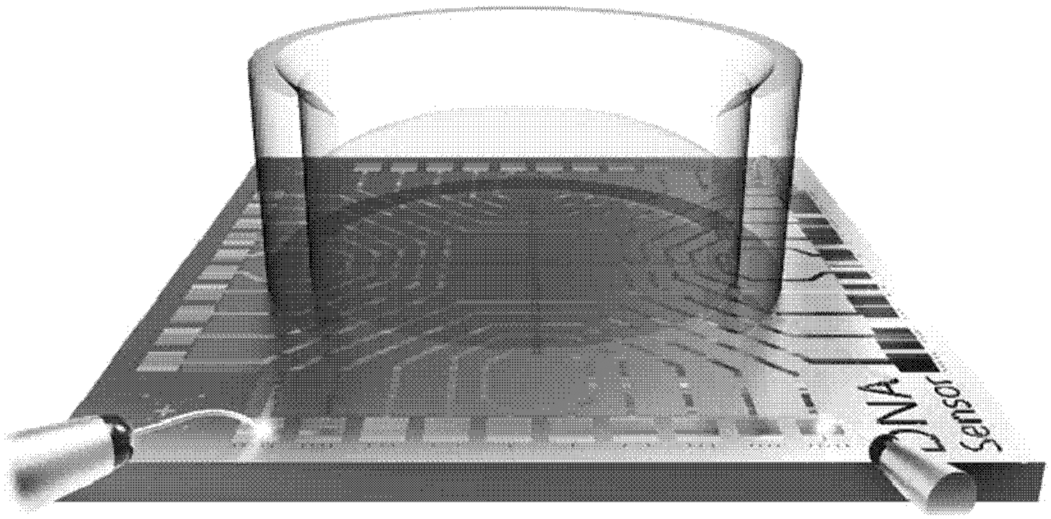

[Fig. 6b]
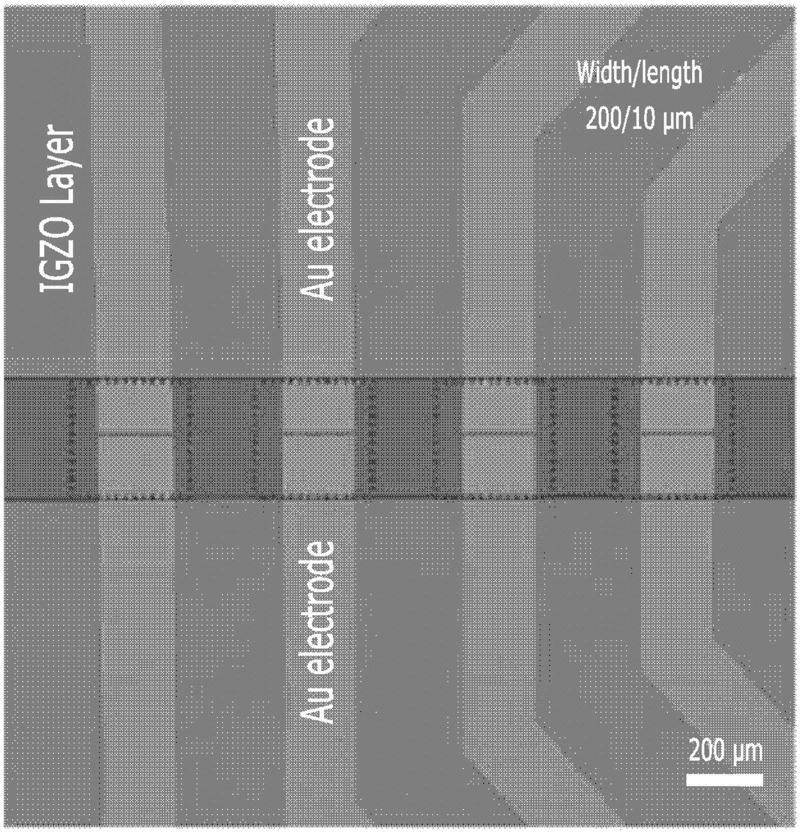

[Fig 7]
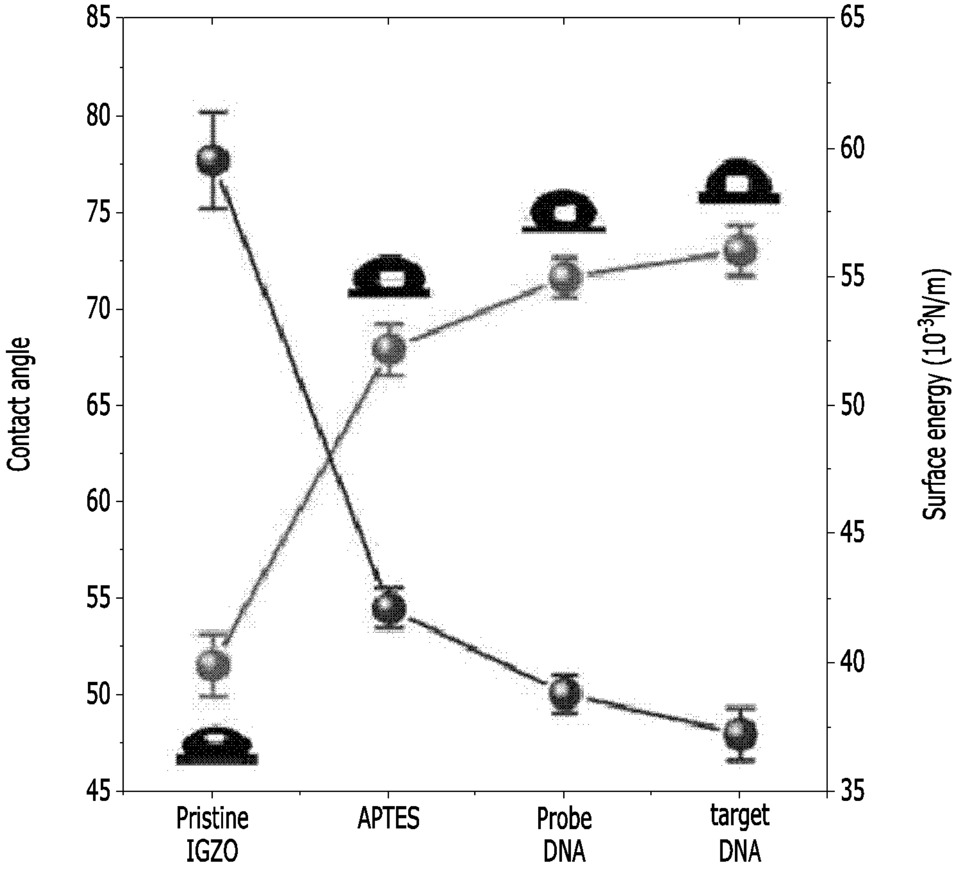

[Fig. 8]
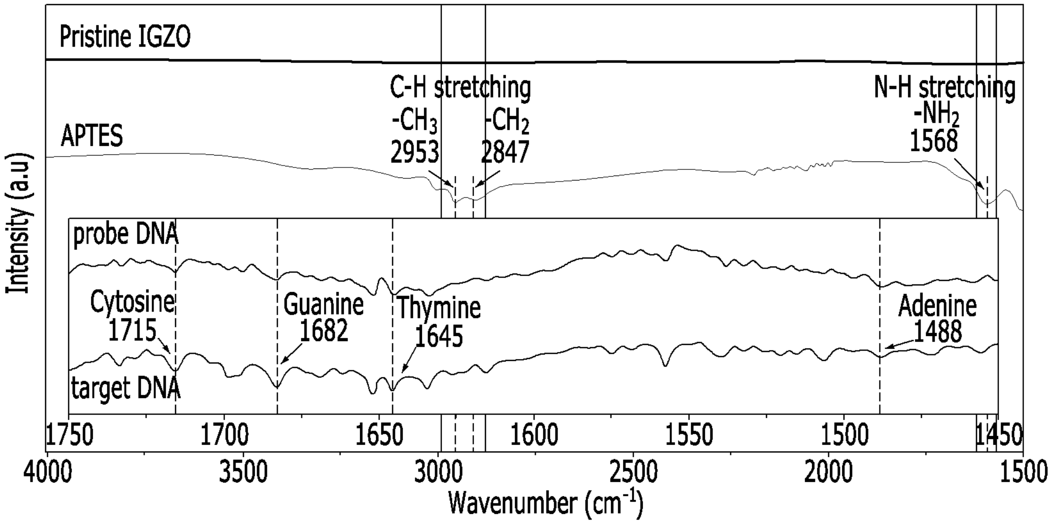
[Fig. 9]
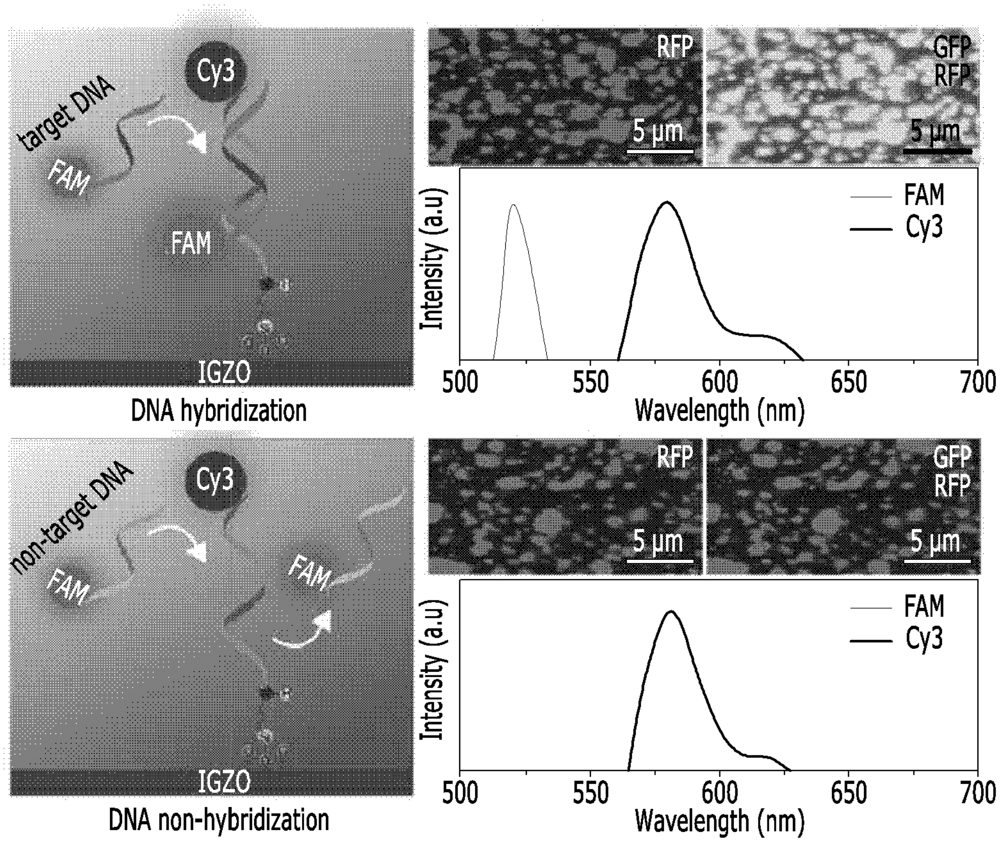

[Fig. 10a]
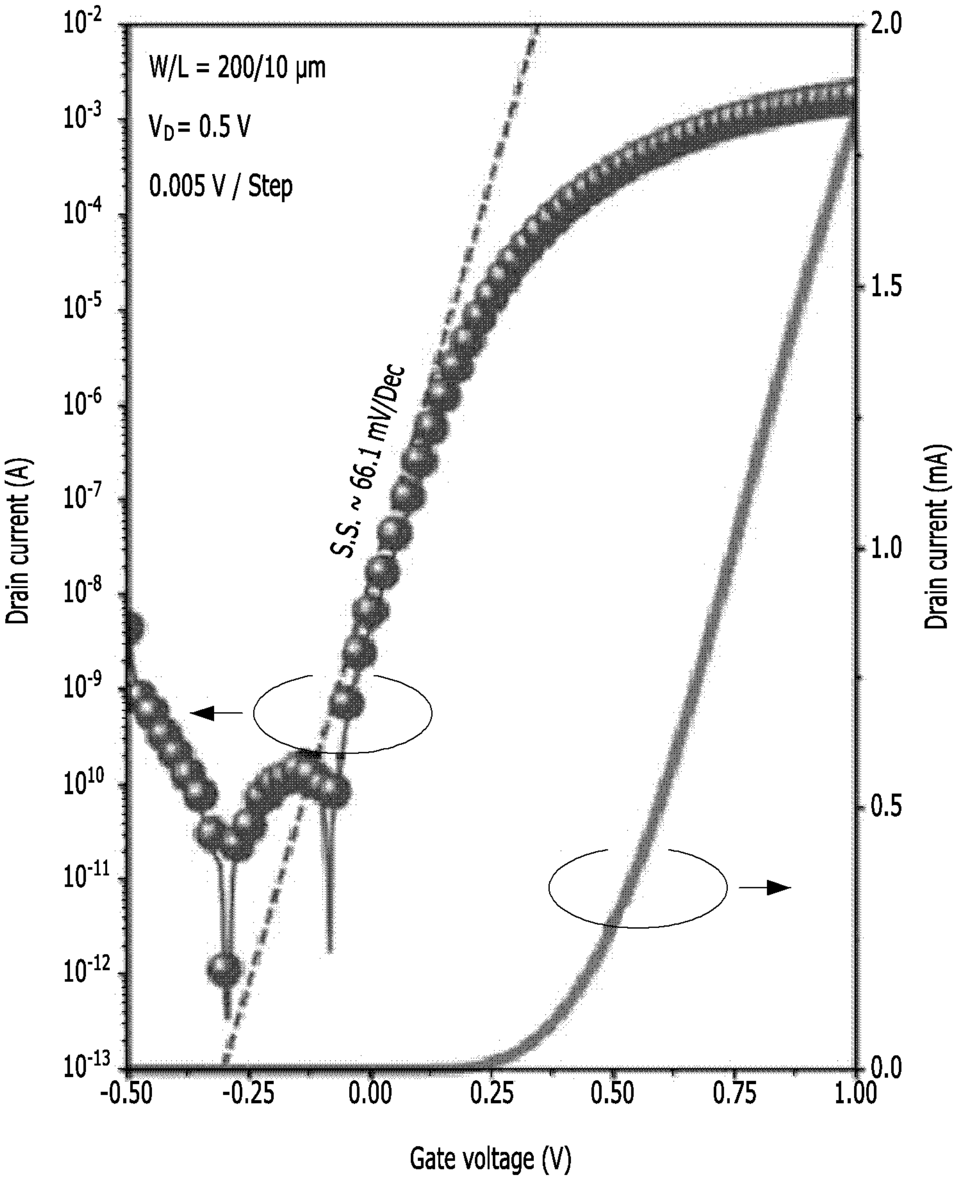

[Fig. 10b]
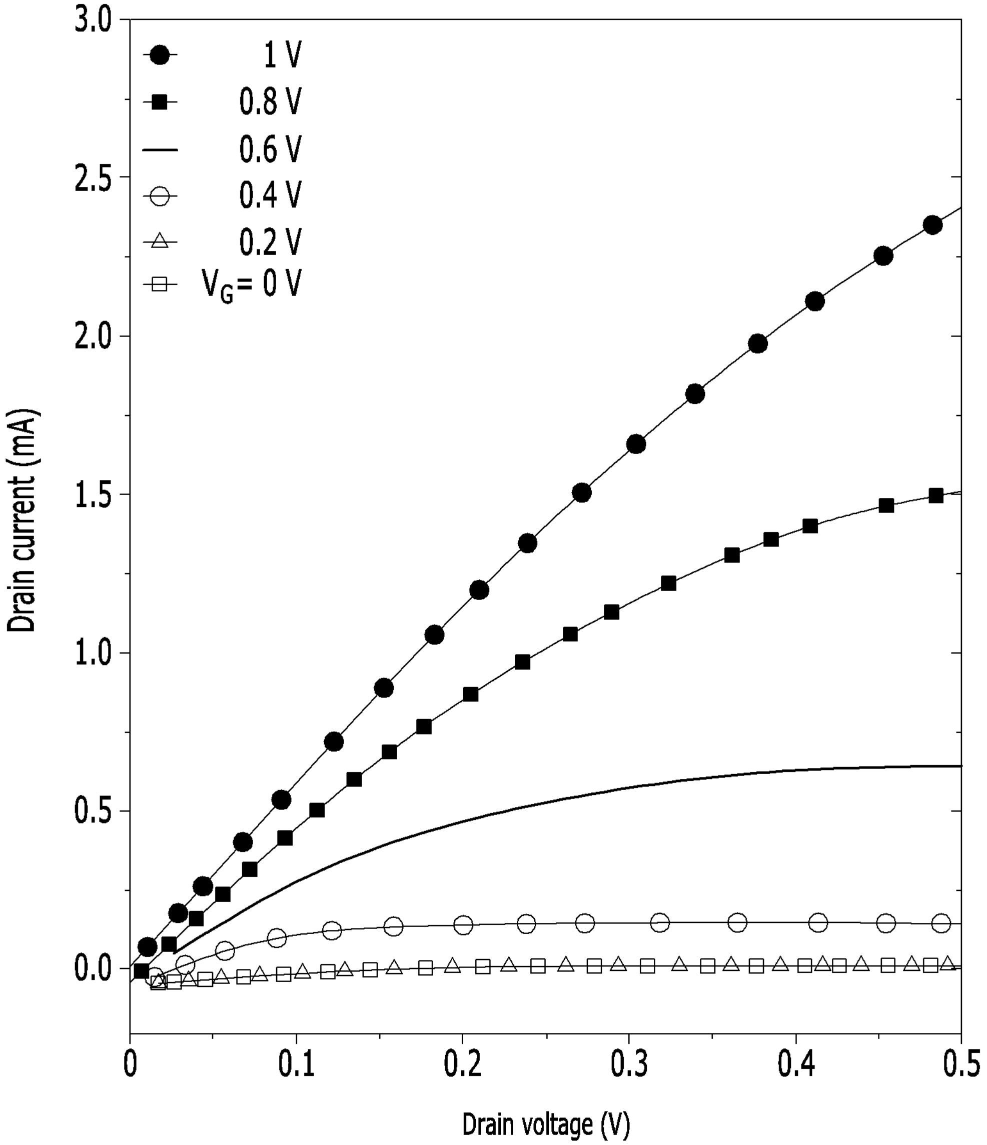

[Fig. 10c]
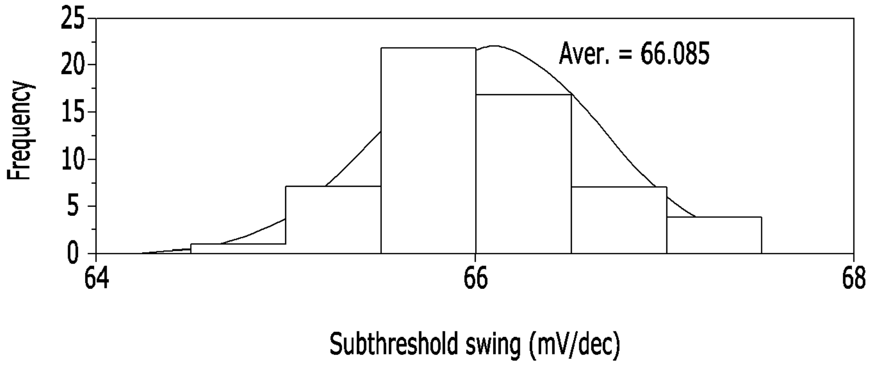
[Fig. 10d]
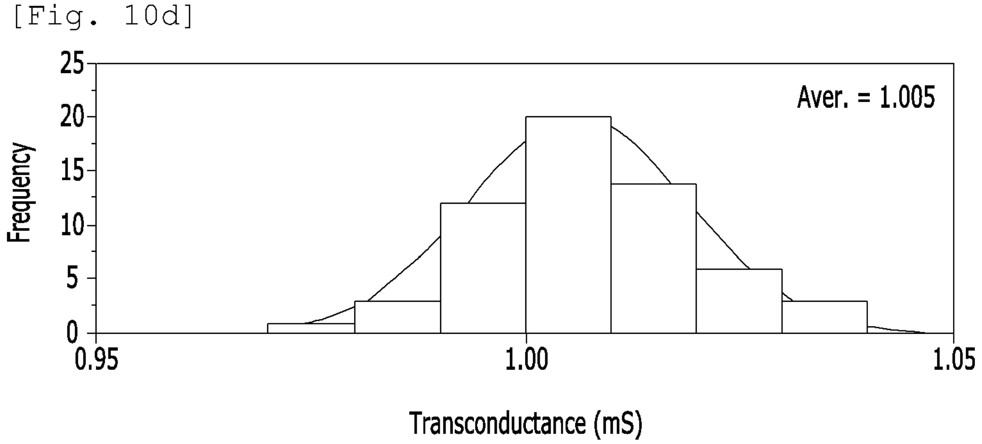
[Fig. 10e]
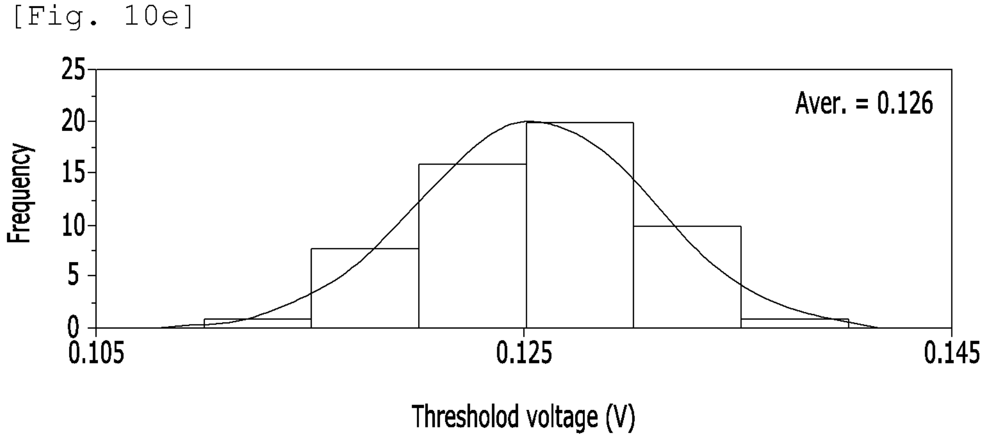

[Fig. 11]
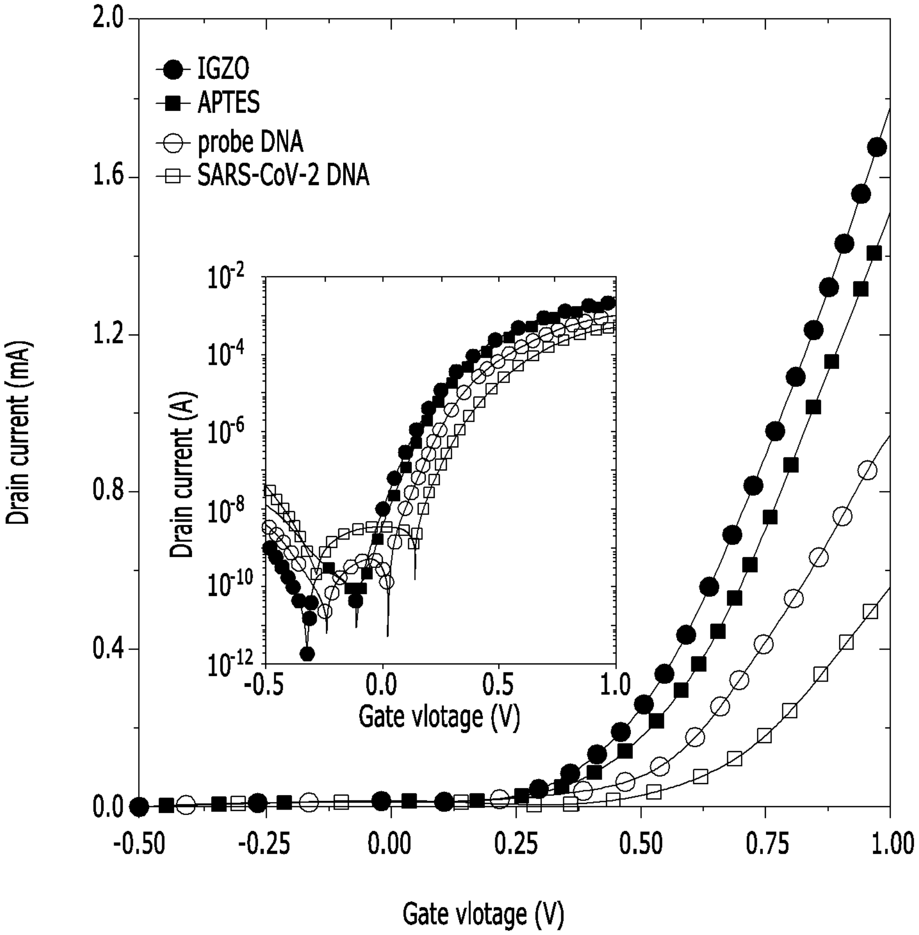

[Fig. 12a]
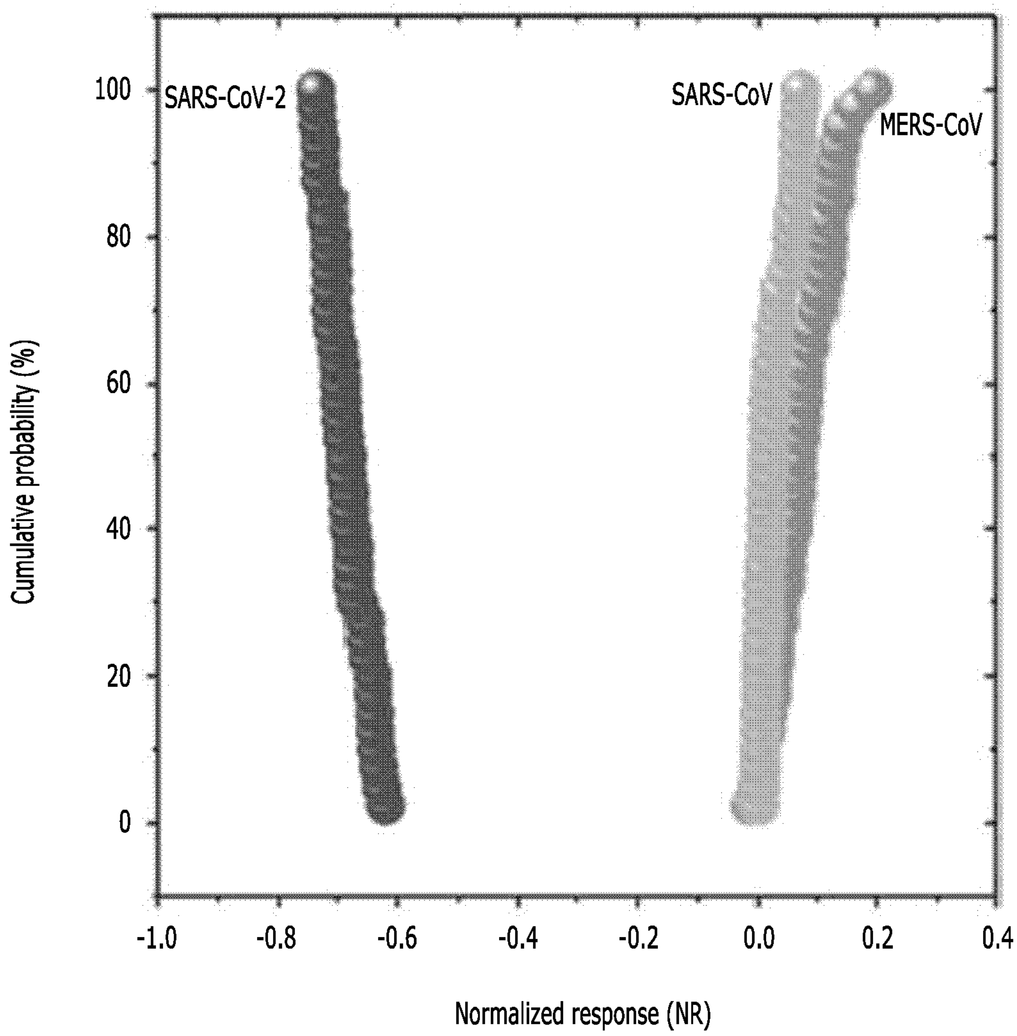

[Fig. 12b]
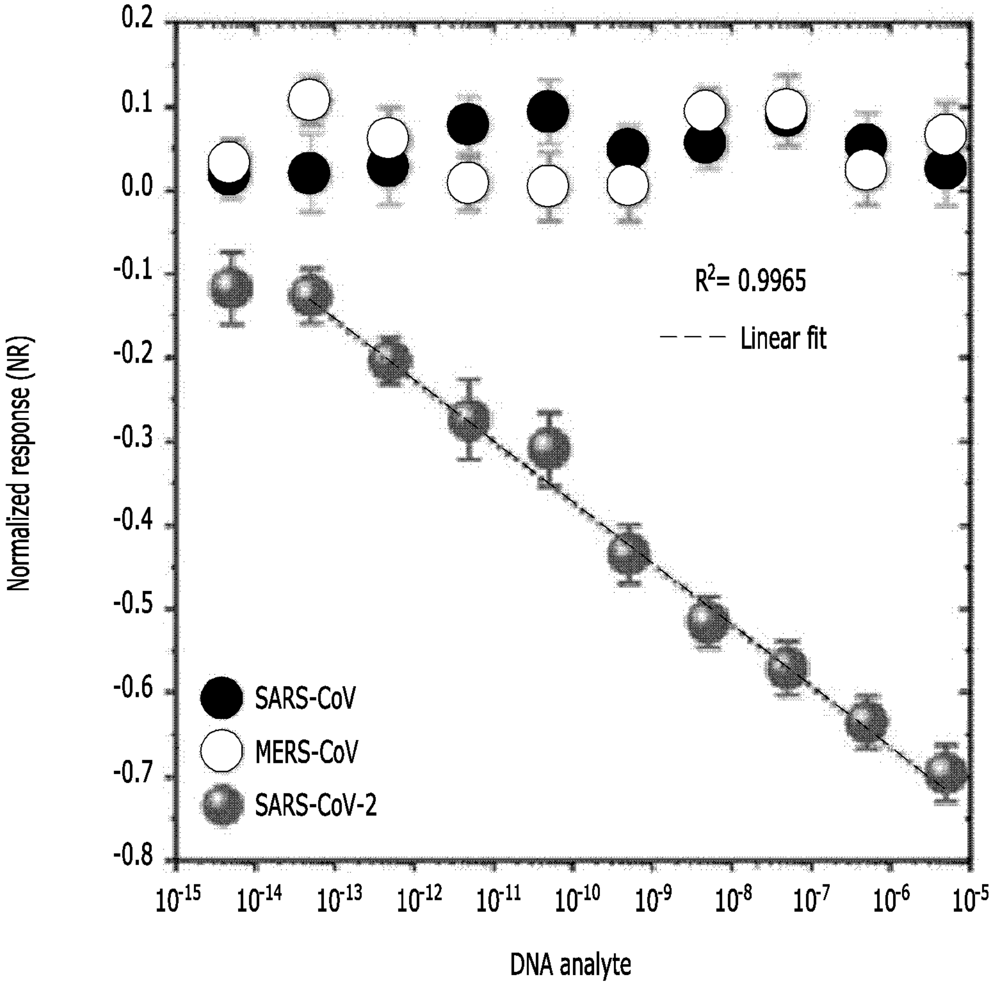

[Fig. 13a]
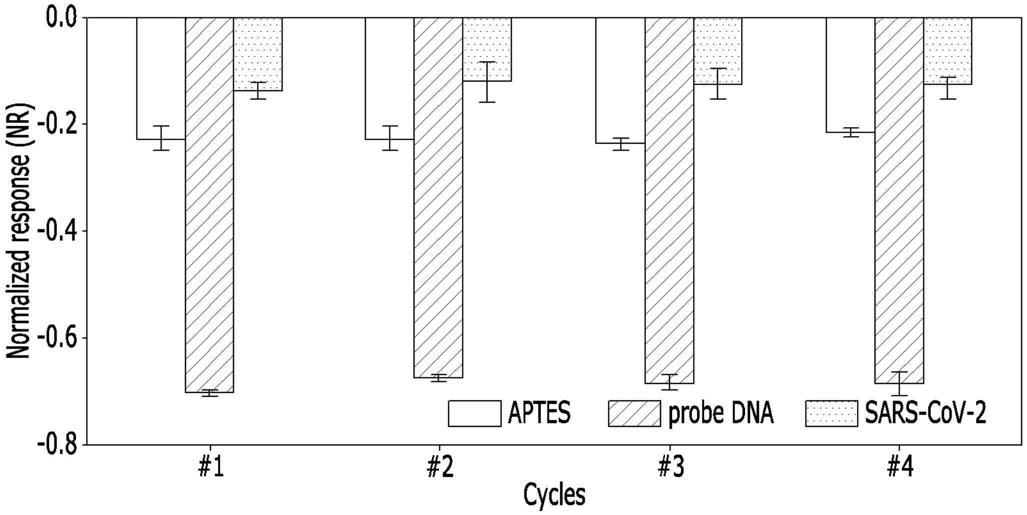
[Fig. 13b]
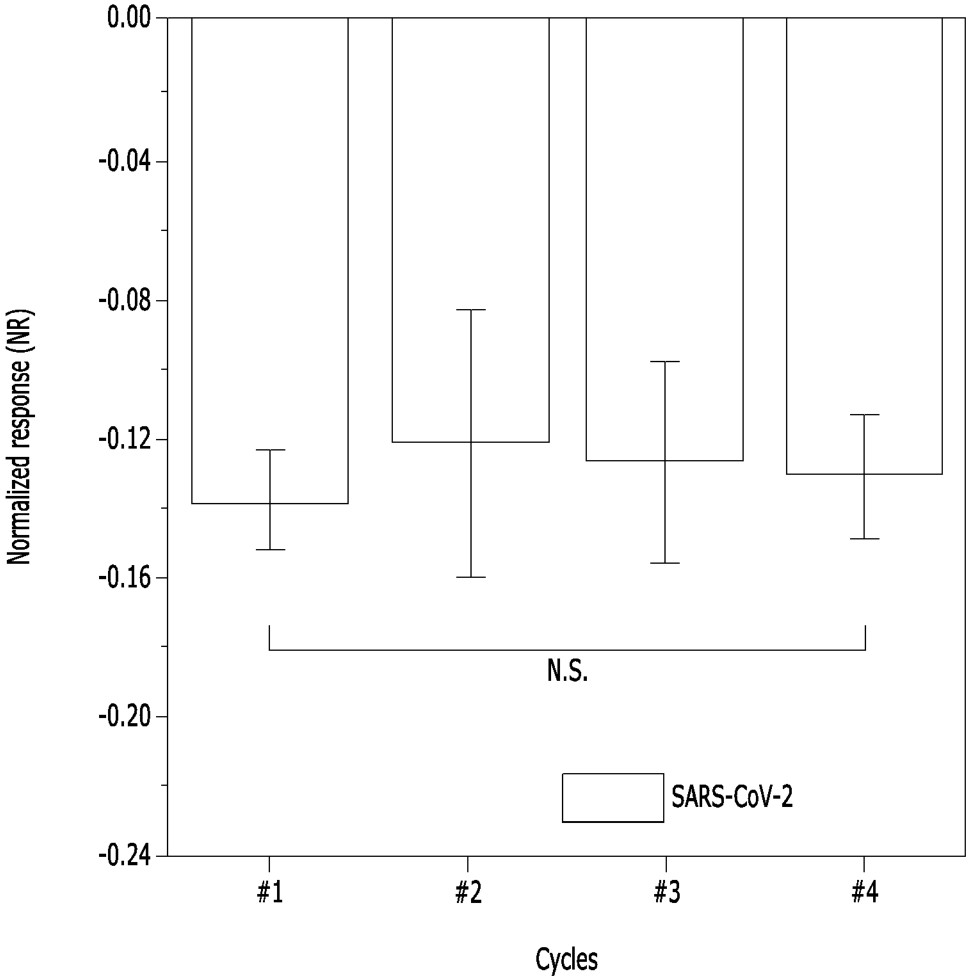

[Fig. 14]
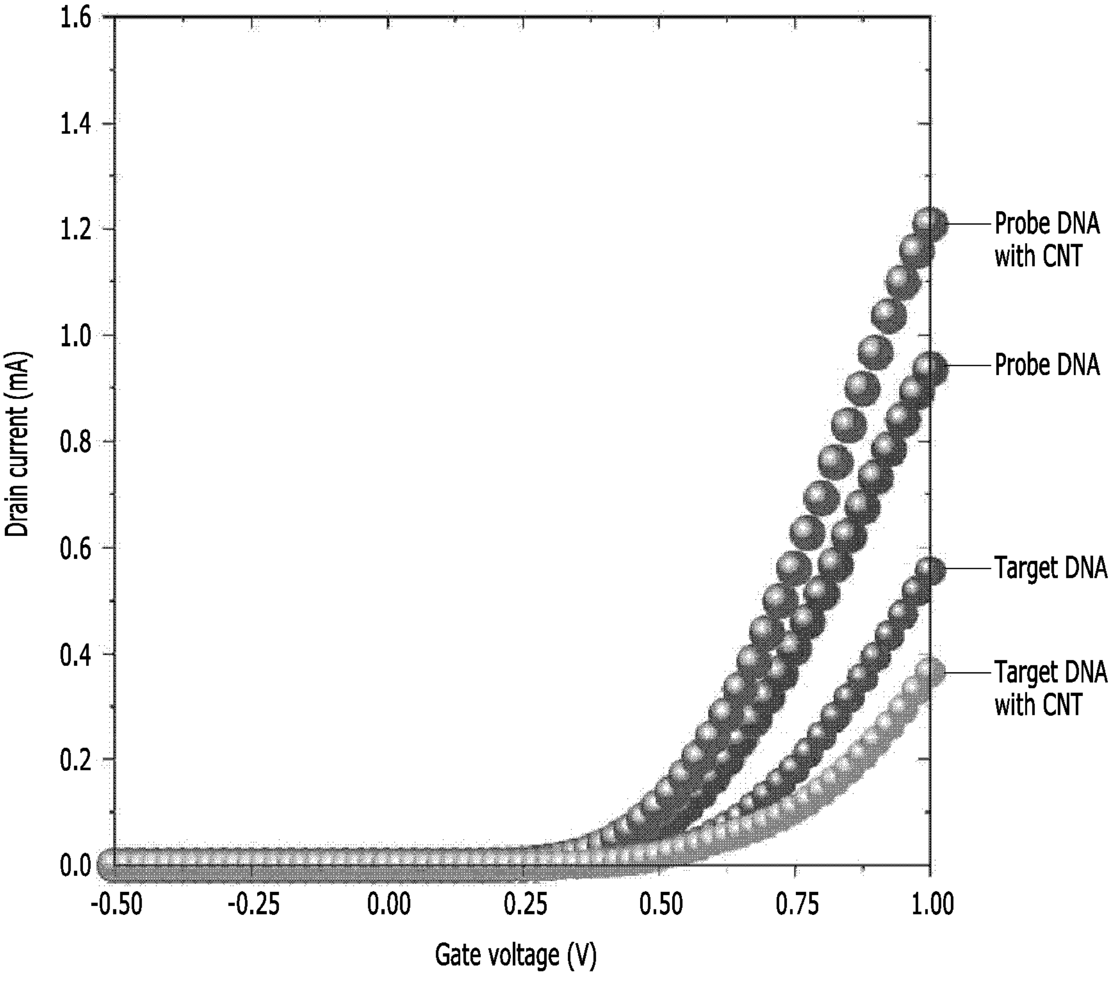

[Fig. 15]
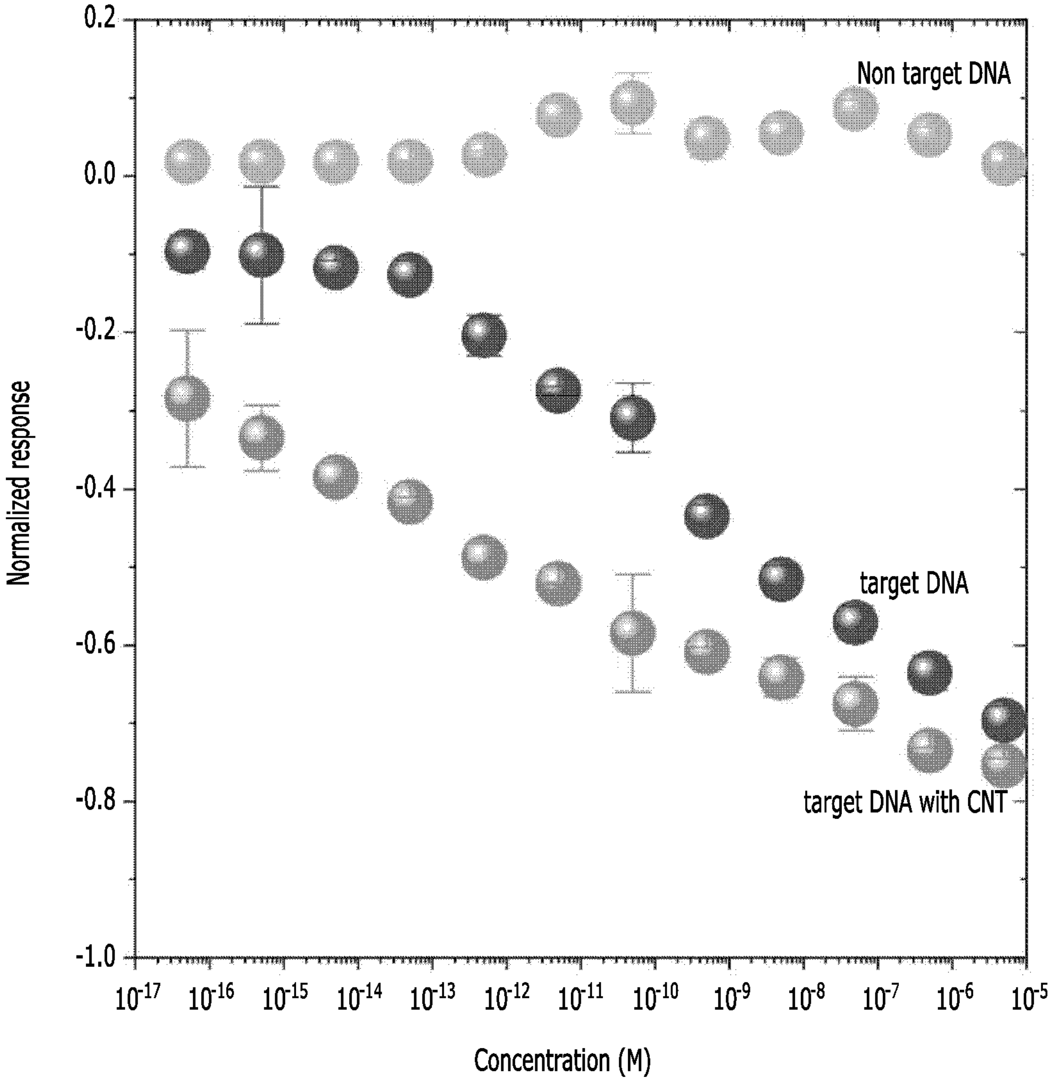

BIOSENSOR BASED ON METAL OXIDE THIN FILM TRANSISTOR AND MANUFACTURING METHOD FOR THE SAME

CROSS-REFERENCE TO RELATED APPLICATIONS

This application claims the priority of Korean Patent Application No. 10-2023-0183293, filed on Dec. 13, 2023 in the Korean Intellectual Property Office, and Korean Patent Application No. 10-2022-0188852, filed on Dec. 29, 2022 in the Korean Intellectual Property Office, the disclosure of which is incorporated herein by reference.

BACKGROUND

Field

The present disclosure relates to a semiconductor-based DNA sensor and a manufacturing method for the same, and particularly, to a biosensor based on a metal oxide thin film transistor and a manufacturing method for the same.

Description of the Related Art

Recently, an amorphous metal oxide (MOx) semiconductor of sol-gel derivatives has been intensively researched for various application fields including a display, a sensor, a memory, and a photovoltaic cell, focusing on flexible transparent electronic devices.

In certain areas of the device application field, an electronic material of this class competes with silicon or surpasses silicon due to unique properties such as low temperature and solution processability, high optical transparency and film uniformity in addition to excellent electrical properties.

Despite the in-depth understanding of these materials and device properties, MOx-based electronic materials have unexplored potentials for non-traditional device application fields such as biochemical sensors and transplantable human-machine interfaces in vivo, and gradually obtain technological and social attentions.

However, no electronic device that uses the electrolyte environment has been developed, and charge transportation on an interface of water-metal oxide that mimics the physiological electrolyte conditions of the human body has not yet been systematically investigated.

An electrolyte gate thin film transistor (EGTFT) is a thin film transistor type in which various types of electrolyte-containing dielectrics are used as gate insulation media.

An area capacitance of the general dielectric material used in the existing TFT is in the range of 0.005 $\mu F/cm^2$ to 0.5 $\mu F/cm^2$, which is determined and limited by thickness and dielectric constant. However, an electrolyte-based electric double layer (EDL) is virtually not dependent on the thickness of an electric membrane and usually represents a very large area capacitance larger than 10 $\mu F/cm^2$.

In a simplified model, EDL operates similarly to two conventional parallel plate capacitors, in which ions in which a high density surface charge and a liquid electrolyte of a solid electrode are reversely charged are sorted in a phase interface at an interval of an angstrom (Å) scale.

This function enables efficient carrier accumulation in active channels and low voltage operation in various EGTFTs. Frisbie, Dasgupta, Iwasa, and Zaumseil groups successfully demonstrate low voltage MOx EGTFT using ionic liquid or polymer electrolyte, but some of these TFTs are confirmed to be significantly lowered during a long-term operation according to peripheral conditions.

In addition, despite the potential of high-performance electronic devices stable in water, there is little study of MOX EGTFT, which operates stably in salt aqueous solutions due to the deterioration of the oxide itself or the device itself.

In the case of similar type of water compatible TFT or organic electrochemical transistor (OECT), an intensive study on a structure of using an organic semiconductor or a conductive polymer (e.g., PEDOT:PSS) has been conducted for the final application in the biomedical system.

However, the general OECT of the aqueous ion solution shows several disadvantages, including a relatively small current on-off ratio, high leakage current at a polymer electrolyte interface, slow dynamic responses, and narrow operating voltage properties.

The technology that is the background of the present disclosure, Korean Patent Unexamined Publication No. 10-2022-0141741, relates to a single-stranded DNA sensor and a single-stranded DNA sensor manufacturing method.

SUMMARY

In order to solve the problems in the related art, an object of the present disclosure is to provide a semiconductor-based DNA sensor and a manufacturing method for the same.

However, a technical object to be achieved by the exemplary embodiment of the present disclosure is not limited to the technical objects and there may be other technical objects.

According to a first aspect of present disclosure, there is provided a semiconductor-based DNA sensor which includes: a first electrode and a second electrode disposed on a substrate to be spaced apart from each other; a channel layer disposed between the first electrode and the second electrode; a target coupling layer disposed on the channel layer, and including probe DNA detecting target DNA through a hybridization reaction; a passivation layer selectively exposing an upper portion of the target coupling layer; and a gate layer disposed at a lower portion and/or an upper portion of the substrate, or an upper portion of the target coupling layer, in which the channel layer includes a metal oxide and a carbon nano tube.

According to an embodiment of the present disclosure, the metal oxide may include indium, gallium, and zinc, but is not limited thereto.

According to an embodiment of the present disclosure, the metal oxide may include In-GA-Zn oxide, but is not limited thereto.

According to an embodiment of the present disclosure, the target coupling layer may include 3-Aminopropyltriehoxysilane (APTES) and probe DNA, and may be covalent bonding between an amino group of the APTES and phosphate of the probe DNA, but is not limited thereto.

According to an embodiment of the present disclosure, each of the first electrode and the second electrode may be independently selected from the group consisting of Au, Zr, Ti, Fe, Ni, Cr, Pt, and combinations thereof, but is not limited thereto.

According to an embodiment of the present disclosure, the semiconductor-based DNA sensor may additionally include an electrolyte layer disposed at the upper portion of the target coupling layer, but is not limited thereto.

According to an embodiment of the present disclosure, the gate layer may be disposed on the electrolyte layer, or disposed at the lower portion and/or the upper portion of the substrate, but is not limited thereto.

According to an embodiment of the present disclosure, the electrolyte layer may include a layer selected from the group consisting of phosphate-buffered saline (PBS), NaCl, KCl, KBr, and combinations thereof, but is not limited thereto.

Further, according to a second aspect of the present disclosure, there is provided a manufacturing method of a semiconductor-based DNA sensor, which includes: disposing a first electrode and a second electrode on a substrate to be spaced apart from each other; forming a channel layer between the first electrode and the second electrode; forming a passivation layer on the first electrode and the second electrode; forming a target coupling layer capable of detecting target DNA on the channel layer; and disposing a gate layer at a lower portion and/or an upper portion of the substrate, or an upper portion of the target coupling layer, in which the channel layer includes a metal oxide and a carbon nano tube.

According to an embodiment of the present disclosure, the forming of the channel layer may include applying a solution including a metal oxide precursor and the carbon nano tube, and curing the solution, but is not limited thereto.

According to an embodiment of the present disclosure, the precursor of the metal oxide may include nitrate indium hydrate ($In(NO_3)_3 \cdot x(H_2O)$), nitrate gallium hydrate ($Ga(NO_3)_3 \cdot x(H_2O)$), and zinc acetate dehydrate ($Zn(CH_3COO)_2 \cdot 2(H_2O)$), but is not limited thereto.

According to an embodiment of the present disclosure, the solution may be a solution which is dissolved in a 2-methoxyethanol solvent so that the nitrate indium hydrate, the nitrate gallium hydrate, and the zinc acetate dehydrate have a molar ratio of 0.1:0.15:0.0275, but is not limited thereto.

According to an embodiment of the present disclosure, the forming of the target coupling layer may include hydrophilically treating the upper portion of the channel layer, applying amino silane to the upper portion of the channel layer, and forming mutual covalent bonding by silanization-reacting phosphate of the probe DNA and the amino silane, but is not limited thereto.

According to an embodiment of the present disclosure, the disposing of the gate layer may include forming an electrolyte layer at the upper portion of the target coupling layer, and disposing the gate layer on the electrolyte layer, or include disposing a gate layer at the lower portion and/or the upper portion of the substrate, but is not limited thereto.

The above-described task resolution means is only an example, and should not be interpreted as the intention to restrict this disclosure. In addition to the exemplary embodiments described above, there may be additional exemplary embodiments in drawings and the detailed description of the present disclosure.

According to the solving means of the present disclosure, a semiconductor-based DNA sensor according to the present disclosure uses a high-performance electrolyte gate thin film transistor using a sol-gel amorphous IGZO semiconductor and an aqueous salt dielectric to operate at an operating voltage below 0.5 V, and shows a high on/off current ratio, excellent transconductance, and clear pinch-off characteristics to be applicable to a field diagnosis kit.

In particular, the semiconductor-based DNA sensor is possible to operate at low voltage, so the semiconductor-based DNA sensor may be used relatively for a long time, and there is an effect that may contribute to the development of future human-friendly biological electronics such as biochemical sensors or transplantable biotechnology in vivo.

Further, the semiconductor-based DNA sensor according to the present disclosure, may increase precision, sensitivity, and accuracy of a biosensor due to excellent electrical characteristics of carbon nano tube (CNT) included in a channel layer.

However, the effects that can be obtained herein are not limited to the effects described above, and there may be other effects.

BRIEF DESCRIPTION OF THE DRAWINGS

The above and other aspects, features and other advantages of the present disclosure will be more clearly understood from the following detailed description taken in conjunction with the accompanying drawings, in which:

FIG. 3 is a schematic view of DNA according to an embodiment of the present disclosure;

FIG. 4 represents a bonding process of DNA in the semiconductor-based DNA sensor according to an embodiment of the present disclosure;

FIG. 5 represents DNA according to an embodiment of the present disclosure;

FIG. 6A is a schematic view of a semiconductor-based DNA sensor according to an exemplary embodiment of the present disclosure, and FIG. 6B illustrates a part of FIG. 6A enlarged and photographed;

FIG. 7 illustrates a surface contact angle of the semiconductor-based DNA sensor according to an exemplary embodiment of the present disclosure;

FIG. 8 illustrates a Fourier transform infrared spectrum of the semiconductor-based DNA sensor according to an exemplary embodiment of the present disclosure;

FIG. 9 illustrates a fluorescence result of the semiconductor-based DNA sensor according to an exemplary embodiment of the present disclosure;

FIG. 10A illustrates transfer characteristics of the semiconductor-based DNA sensor according to an exemplary embodiment of the present disclosure, FIG. 10B illustrates output characteristics, and FIGS. 10C to 10E represent histograms for subthreshold swing, transconductance, and threshold voltage, respectively;

FIG. 11 illustrates the transfer characteristics of the semiconductor-based DNA sensor according to an exemplary embodiment of the present disclosure;

FIG. 12A illustrates the selectivity of the semiconductor-based DNA sensor according to an exemplary embodiment of the present disclosure, and FIG. 12B illustrates the reactivity of the semiconductor-based DNA sensor;

FIGS. 13A and 13B illustrate a test of repeatability of the semiconductor-based DNA sensor according to an exemplary embodiment of the present disclosure;

FIG. 14 is a graph illustrating a current change of the semiconductor-based DNA sensor according to an exemplary embodiment of the present disclosure; and FIG. 15 is a graph for measuring a sensitivity of the semiconductor-based DNA sensor according to an exemplary embodiment of the present disclosure.

DETAILED DESCRIPTION OF THE EMBODIMENT

Figure 1A:
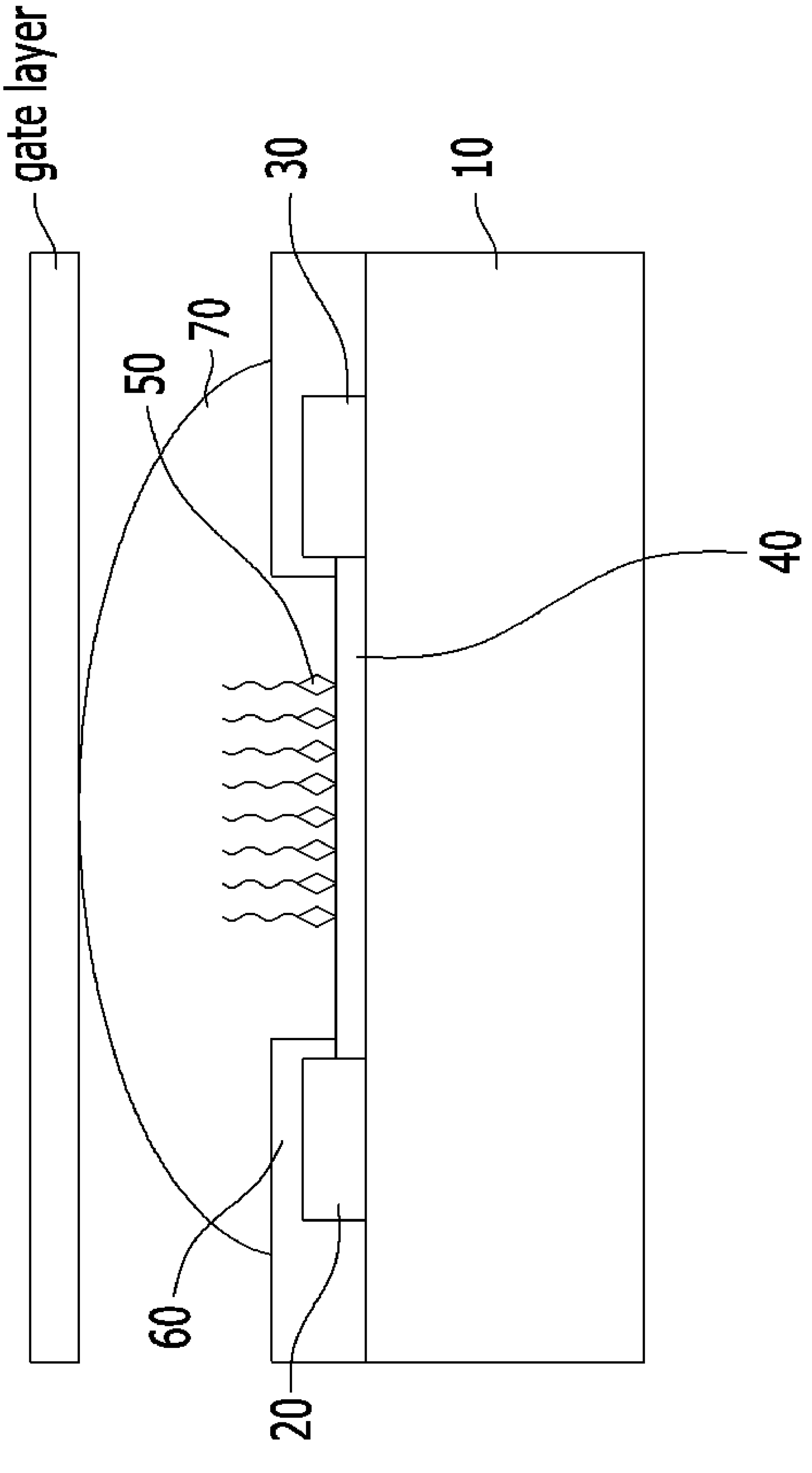
FIGS. 1A-1B are configuration diagrams of a semiconductor-based DNA sensor according to an embodiment of the present disclosure.

Hereinafter, exemplary embodiments of the present disclosure will be described in detail so as to be easily implemented by those skilled in the art, with reference to the accompanying drawings. However, the present disclosure may be implemented in various different forms and is not limited to exemplary embodiments described herein. In addition, in the drawings, in order to clearly describe the present disclosure, a part not related to the description is omitted and like reference numerals designate like elements throughout the present specification.

Throughout the specification of the present disclosure, when it is described that a part is "connected" with another part, it means that the certain part may be "directly connected" with another part and the elements "electrically connected" to each other with a third element interposed therebetween as well.

Throughout this specification, it will be understood that when a member is referred to as being "on", "at an upper portion of", "on the top of", "beneath", "at a lower portion of", and "on the bottom of" another member, it can be directly on the other member or intervening members may also be present.

Throughout the specification of the present disclosure, unless explicitly described to the contrary, the word "comprise" and variations such as "comprises" or "comprising" will be understood to imply the inclusion of stated elements but not the exclusion of any other elements.

The terms used in the present specification, "approximately", "substantially", etc. are used in the meaning or close to that value, when the inherent manufacturing and material allowable error is presented in the mentioned meaning, and to help the understanding of the present disclosure, the terms are used to prevent unjust use of the disclosure containing accurate or absolute figures by unscrupulous infringers. Further, throughout the specification of the present disclosure, "step (of~)" or "step of~" does not mean "step for".

Throughout the specification of the present disclosure, the term "combination thereof" included in the expression of the Makushi form means a mixture of combination of one or more selected from the group consisting of the components described in the expression of the Makushi format, and means including one or more selected from the group consisting of the components.

Throughout the specification of the present disclosure, the disclosure of "A and/or B" means "A and B, or A or B".

Hereinafter, a semiconductor-based DNA sensor and a manufacturing method for the same according to the present disclosure will be described in detail with reference to embodiments and exemplary embodiments, and drawings. However, the present disclosure is not limited to the embodiments and the exemplary embodiments, and the drawings.

As a technical means for achieving the technical object, a first aspect of the present disclosure relates to a semiconductor-based DNA sensor which includes: a first electrode 20 and a second electrode 30 disposed spaced apart from each other on a substrate 10; a channel layer 40 disposed between the first electrode 20 and the second electrode 30; a target coupling layer 50 disposed on the channel layer 40, and including probe DNA detecting target DNA through a hybridization reaction; a passivation layer 60 selectively exposing an upper portion of the target coupling layer 50; and a gate layer disposed at a lower portion and/or an upper portion of the substrate 10 or at an upper portion of the target coupling layer 50, in which the channel layer 40 includes a metal oxide and a carbon nano tube.

Figure 1B:
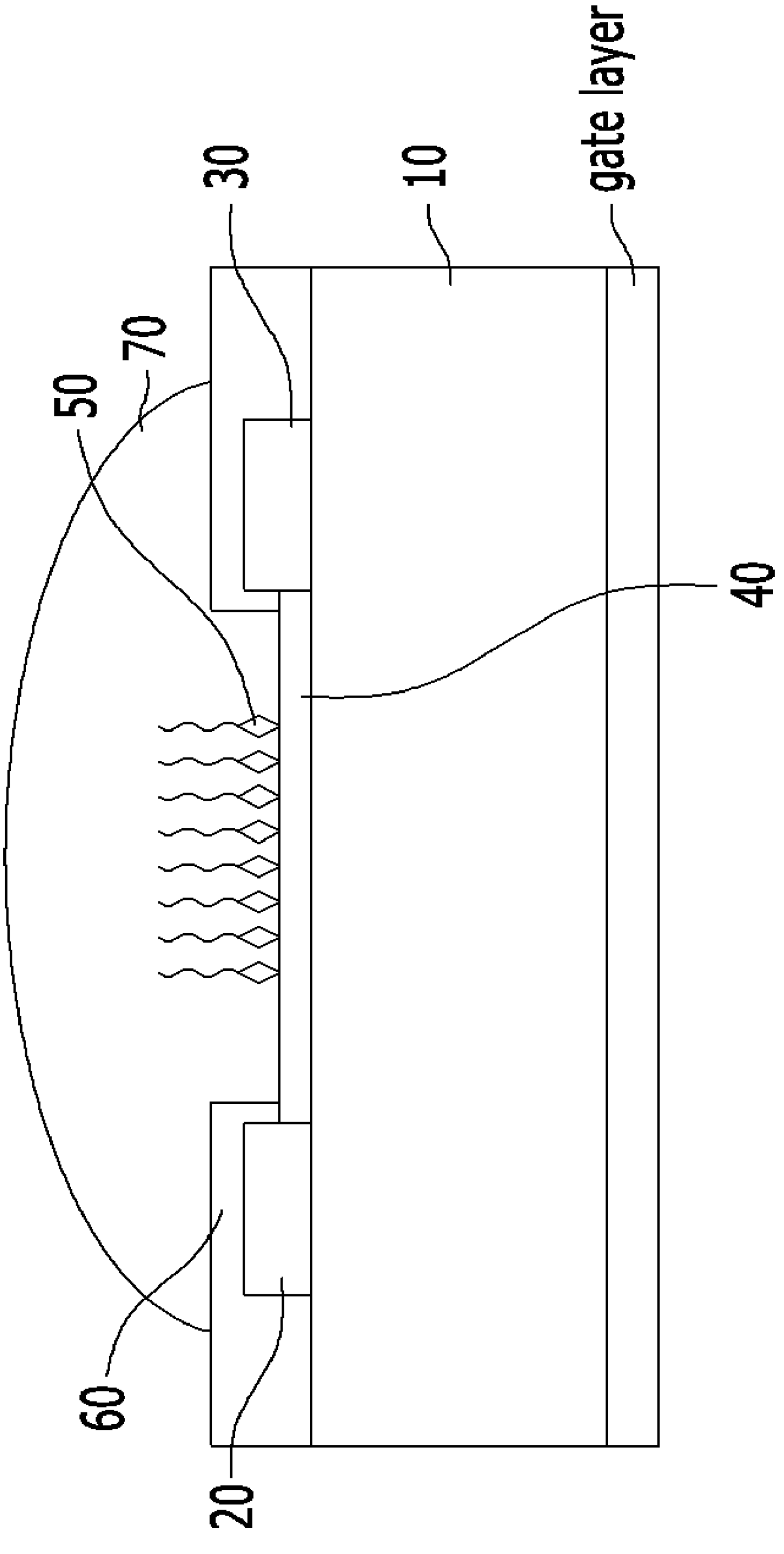

FIGS. 1A-1B are configuration diagrams of a semiconductor-based DNA sensor according to an embodiment of the present disclosure.

Referring to FIGS. 1A-1B, an electrolyte thin film transistor applied to the present disclosure may be configured to include a substrate 10, a first electrode 20 and a second electrode 30 positioned at a part of an upper portion of the substrate 10 spaced apart from each other, an aqueous derivation channel layer 40 positioned at the upper portion of the substrate 10 between the first electrode 20 and the second electrode 30, a target coupling layer 50 laminated at the upper portion of the channel layer 40, a passivation layer 60 covering the first electrode 20 and the second electrode 30, and exposing the channel layer 40 and the target coupling layer 50, and an electrolyte layer 70 positioned at the upper portions of the passivation layer 60, the exposed channel layer 40, and the target coupling layer 50. Although described below, the gate layer may be disposed at the lower portion and/or the upper portion of the substrate 10, or the upper portion of the electrolyte layer 70, and the electrolyte layer 70 is positioned at the upper portion of the target coupling layer 50, and disposed between the gate layer and the target coupling layer 50.

According to an embodiment of the present disclosure, the metal oxide may include indium, gallium, and zinc, but is not limited thereto.

According to an embodiment of the present disclosure, the metal oxide may include In-GA—Zn oxide, but is not limited thereto.

Preferably, the metal oxide may include In—Ga—Zn Oxide (IGZO), and the channel layer 40 may include IGZO and carbon nano tube.

According to an embodiment of the present disclosure, the channel layer 40 may include 99 parts by weight to 99.999 parts by weight of metal oxide, and 0.001 part by weight to 1 part by weight of carbon nano tube, for 100 parts by weight of the channel layer 40, but is not limited thereto.

According to an embodiment of the present disclosure, the carbon nano tube may be single-wall carbon nano tube (SWCNT) or multi wall carbon nano tube (MWCNT), but is not limited thereto.

The carbon nano tube of the channel layer 40 may increase the precision, sensitivity, and accuracy of the biosensor due to the excellent electrical characteristics of the carbon nano tube.

In FIGS. 1A-1B, the gate layer is omitted, but may be disposed at the lower portion and/or upper portion of the substrate 10, or at the upper portion of the electrolyte layer 70, and if the voltage is applied to the gate layer, current may flow between the first electrode 20 and the second electrode 30.

The first electrode 20 may be used as a source electrode, and the second electrode 30 and the channel layer 40 may be used as drain electrodes.

According to an embodiment of the present disclosure, each of the first electrode 20 and the second electrode 30 may be independently selected from the group consisting of Au, Zr, Ti, Fe, Ni, Cr, Pt, and combinations thereof, but is not limited thereto.

According to an embodiment of the present disclosure, the gate layer may be selected from the group consisting of Au, Zr, Ti, Fe, Ni, Cr, Pt, and combinations thereof, but is not limited thereto.

According to an embodiment of the present disclosure, the target coupling layer 50 may include 3-Aminopropyltriehoxysilane (APTES) and probe DNA, and may be covalent bonding between an amino group of the APTES and phosphate of the probe DNA, but is not limited thereto.

The target coupling layer 50 couples target DNA of which the base sequence is complementary with DNA of the virus to be detected to the channel layer 40 to detect the target DNA by the hybridization reaction.

In this case, the target DNA may be determined according to the type of virus to be detected, and the probe DNA having a complementary base sequence may be determined according to the target DNA.

Preferably, the target DNA may include SARS-CoV-2 DNA, but is not limited thereto.

The semiconductor-based DNA sensor according to the present disclosure immobilizes the probe DNA to the upper portion of the channel layer 40 through covalent bonding, and detects SARS-CoV-2 DNA through the hybridization reaction.

Specifically, when targeted DNA (target DNA) is coupled to the probe DNA at the upper portion of the target coupling layer 50, intensities of currents passing through the first electrode 20, the second electrode 30, and the channel layer 40 are changed to measure a content or a concentration of the target DNA.

According to an embodiment of the present disclosure, the semiconductor-based DNA sensor may additionally include an electrolyte layer 70 disposed at the upper portion of the target coupling layer 50, but is not limited thereto.

According to an embodiment of the present disclosure, the gate layer may be disposed on the electrolyte layer 70, or disposed at the lower portion and/or the upper portion of the substrate 10, but is not limited thereto.

Specifically, the gate layer may be disposed on the electrolyte layer 70, the lower portion or the upper portion of the substrate 10, or disposed at both the lower portion and the upper portion of the substrate 10, but is not limited thereto.

According to an embodiment of the present disclosure, the electrolyte layer 70 may include a layer selected from the group consisting of phosphate-buffered saline (PBS), NaCl, KCl, KBr, and combinations thereof, but is not limited thereto.

The substrate 10 may adopt a quartz wafer, but adopt Si, or Ga-based or sapphire substrate 10.

The substrate 10 adopts a flat square-shaped substrate 10 having each side length of 2 cm.

Although described below, the substrate 10 is washed with at least one of DI water, acetone, and isopropanol, and dried with nitrogen, and used.

Further, a second aspect of the present disclosure relates to a manufacturing method of a semiconductor-based DNA sensor, which includes: disposing a first electrode 20 and a second electrode 30 spaced apart from each other on a substrate 10; forming a channel layer 40 between the first electrode 20 and the second electrode 30; forming a passivation layer 60 on the first electrode 20 and the second electrode 30; forming a target coupling layer 50 capable of detecting target DNA on the channel layer 40; and disposing a gate layer at a lower portion and/or an upper portion of the substrate 10, or an upper portion of the target coupling layer 50, in which the channel layer 40 includes a metal oxide and a carbon nano tube.

Figure 2:
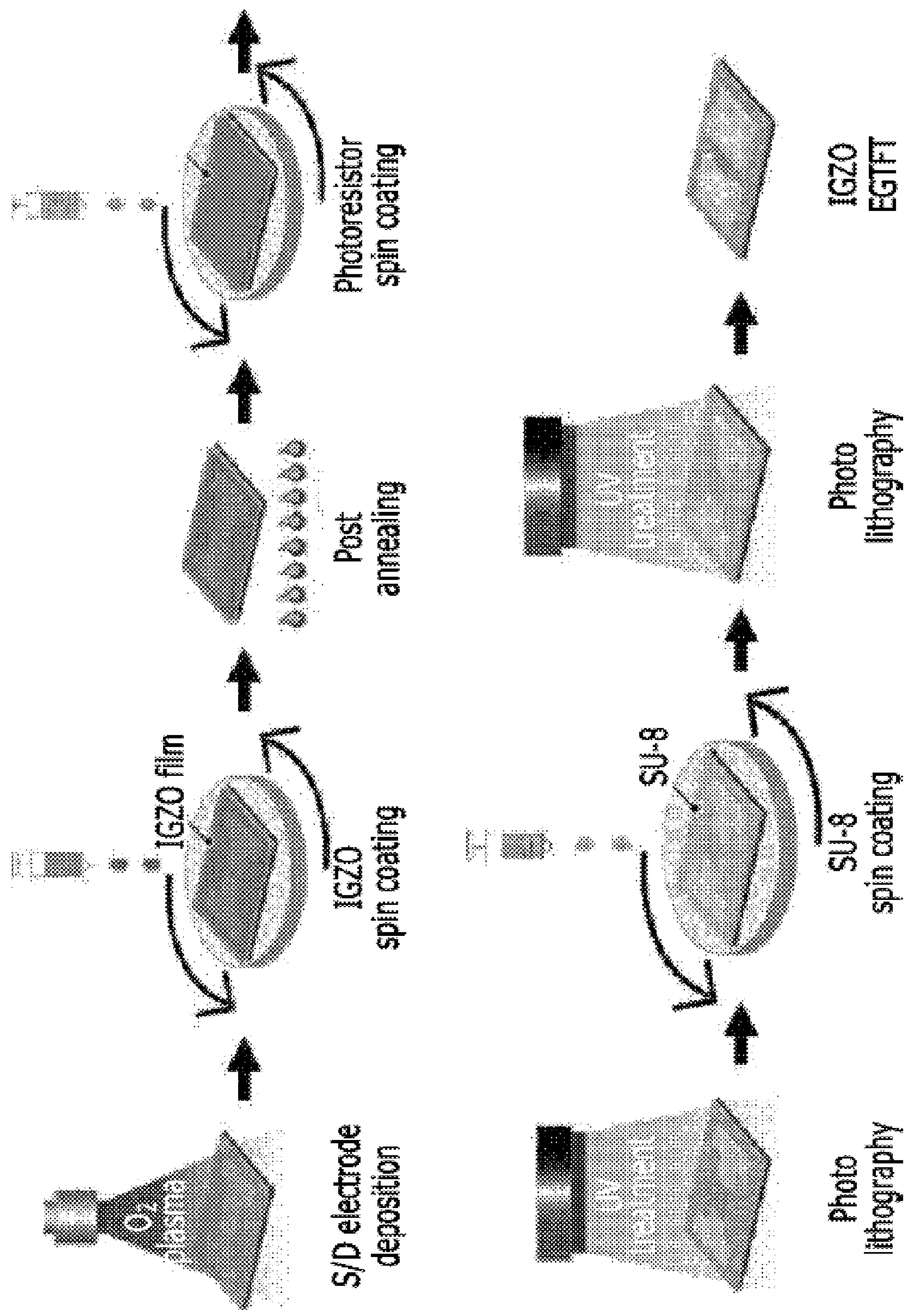
FIG. 2 is a manufacturing method of a semiconductor-based DNA sensor according to an embodiment of the present disclosure.

FIG. 2 is a manufacturing method of a semiconductor-based DNA sensor according to an embodiment of the present disclosure.

The manufacturing method of the semiconductor-based DNA sensor according to the second aspect of the present disclosure relates to a method for manufacturing the semiconductor-based DNA sensor according to the first aspect.

First, the first electrode 20 and the second electrode 30 spaced apart from each other are disposed on the substrate 10.

The first electrode 20 and the second electrode 30 are deposited on the substrate 10, and patterned by using a photolithography process to form an electrode structure in which the electrodes are spaced apart from each other by a predetermined interval.

Preferably, the first electrode 20 and the second electrode 30 have a lamination structure of Cr/Au or a lamination structure of Ti/Au, respectively.

In this case, it is preferable that a thickness of Cr or Ti is 50±5 Å and a thickness of Au is 1000±100 Å.

Specifically, each of the first electrode 20 and the second electrode 30 is deposited on a full surface of the upper portion of the substrate 10 by a thermal deposition method in which a deposition speed is 0.2 Å/s or less under a pressure in which a base pressure is $3\times10^{-6}$ torr or less, and selectively etched by a photolithography method to be formed.

Subsequently, the channel layer 40 is formed between the first electrode 20 and the second electrode 30.

According to an embodiment of the present disclosure, the forming of the channel layer 40 may include applying a solution including a metal oxide precursor and a carbon nano tube, and curing the solution, but is not limited thereto.

Specifically, SWCNT or MWCNT is mixed in deionized water to become a concentration of 0.1 wt %, and then subjected to vortexing for 3 minutes, and then an MWCNT dispersion liquid of 0.1 wt % and IGZO filtered with PTFE syringe of 0.2 μm are mixed at a ratio of 1:100, and then subjected to vortexing for 3 minutes to form a solution including the metal oxide and the carbon nano tube.

According to an embodiment of the present disclosure, the precursor of the metal oxide may include nitrate indium hydrate ($In(NO_3)_3\cdot x(H_2O)$), nitrate gallium hydrate ($Ga(NO_3)_3\cdot x(H_2O)$), and zinc acetate dehydrate ($Zn(CH_3COO)_2\cdot 2(H_2O)$), but is not limited thereto.

According to an embodiment of the present disclosure, the solution may be a solution which is dissolved in a 2-methoxyethanol solvent so that the nitrate indium hydrate, the nitrate gallium hydrate, and the zinc acetate dehydrate have a molar ratio of 0.1:0.15:0.0275, but is not limited thereto.

Specifically, a precursor solution including an indium-gallium-zinc oxide (IGZO) precursor and a carbon nano tube is coated on the substrate 10 in which the first electrode 20 and the second electrode 30 are formed at 3500±100 rpm for 30 seconds by using a spin coater. At this time, unless particularly disclosed, the solution means the precursor solution including the IGZO precursor and the carbon nano tube.

The precursor solution adopts nitrate indium hydrate ($In(NO_3)_3\cdot x(H_2O)$), nitrate gallium hydrate ($Ga(NO_3)_3\cdot x(H_2O)$), and zinc acetate dehydrate ($Zn(CH_3COO)_2\cdot 2(H_2O)$), and is dissolved in the 2-methoxyethanol solvent to become the molar ratio of 0.1:0.15:0.0275 with respect to the nitrate indium hydrate, the nitrate gallium hydrate, and the zinc acetate dehydrate. In this case, the precursor solution is stirred at 75° C. for 12 hours, and kept at room temperature for 30 minutes, and then used.

In this regard, it is confirmed that in order to form the channel layer 40, when the carbon nano tube (for example, SWCNT or MWCNT) is added to the solution including the metal oxide precursor (for example, IGZO precursor), the carbon nano tube begins to be clumped after ultrasound treatment and sunken after a predetermined hour (for example, 4 hours) due to hydrophobicity. In order to prevent such a problem, the carbon nano tube is added to a solution in which sulfuric acid and nitric acid are mixed at a volume ratio of 3:1, a polar functional group is generated on the surface of the carbon nano tube through the ultrasound treatment, and the solution is made to hydrophilicity, and then mixed with the metal oxide precursor solution to form a precursor solution (for example, IGZO-CNT solution) including the metal oxide precursor and the carbon nano tube.

The coated precursor solution is thermally annealed on a hot plate at 350° C. for 1 hour, and cured.

In this case, since the coated and cured channel layer 40 is also formed on the first electrode 20 and the second electrode 30, the channel layer 40 may be patterned through the photolithography or etching process. Preferably, in order to reduce generation of parasitic current and leakage current, the channel layer 40 may be patterned by wet etching (LCE-12).

Subsequently, the passivation layer 60 is formed on the first electrode 20 and the second electrode 30.

According to an embodiment of the present disclosure, before forming the passivation layer 60, a biocompatible material may be applied to the entire surface of the upper portion of the substrate 10 in which the first electrode 20, the second electrode 30, and the channel layer 40 are formed, but is not limited thereto. Preferably, the biocompatible material may mean SU-8 which is epoxy-based photoresist.

The biocompatible material is spin-coated at 5000 rpm for 40 seconds by using the spin coater, and then pre-baked at 65° C. for 2 seconds and 95° C. for 6 minutes, and exposed to ultraviolet rays for 35 seconds in a hard contact mode again, and then developed with a developer for 2 seconds to form the passivation layer 60 exposing the channel layer 40.

In this case, a thickness of the passivation layer 60 becomes 4±0.5 μm.

Subsequently, the target coupling layer 50 capable of detecting target DNA is formed on the channel layer 40.

According to an embodiment of the present disclosure, the forming of the target coupling layer 50 may include performing hydrophilic treatment of an upper portion of the channel layer 40, applying amino silane to the upper portion of the channel layer 40, and forming mutual covalent bonding by silanization-reacting phosphate of probe DNA and the amino silane, but is not limited thereto.

Specifically, an exposure surface of the channel layer 40 is washed with ultraviolet derivation ozone (UVO), and surface-treated to have hydrophilicity. Subsequently, 3-Aminopropyltriehoxysilane (APTES) as a crosslinker is applied to the washed upper portion of the channel layer 40, and the probe DNA is bonded to the crosslinker. The probe DNA is immobilized to form covalent bonding by silanization-reacting phosphate of a terminal and the crosslinker.

In order to confirm the mutual covalent bonding with a microscope, coloration takes place, and to this end, the probe DNA should be bonded to the crosslinker while a fluorescent material is bonded to the probe DNA.

As the fluorescent material, Cy3 (red) and Fem (green) may be used.

FIG. 3 is a schematic view of DNA according to an embodiment of the present disclosure, FIG. 4 represents a bonding process of DNA in the semiconductor-based DNA sensor according to an embodiment of the present disclosure, and FIG. 5 represents DNA according to an embodiment of the present disclosure. Specifically, FIG. 3 is a schematic view for complementary SARS-CoV-2 DNA (SARS-CoV-2 DNA), non-complementary SARS CoV DNA, and non-complementary MERS-CoV DNA. Further, FIG. 4 is a schematic view when an IGZO layer including a metal oxide and a carbon nano tube as an example of the channel layer 40 is treated with APTES, when probe DNA is immobilized to the APTES-treated IGZO layer, and subsequently, when target DNA is hybridized, and FIG. 5 illustrates a difference between cases where the probe DNA and the target DNA or non-target DNA are mixed.

Referring to FIGS. 3 to 5, the APTES is attached to the surface of the channel layer 40, the probe DNA is first immobilized through the APTES, and then the probe DNA and DNA to be detected are mixed. In this case, the probe DNA may include cyanine3 (Cy3) and the DNA to be detected may include 6-fluorescein amidite (FAM). In this regard, targeted DNA (for example, SARS-CoV-2 DNA) is mixed with the probe DNA, and then emits light (for example, red and green) of a wavelength band of 563 nm and a wavelength band of 520 nm, but non-target DNA (for example, SARS-CoV DNA or MERS-CoV-DNA) is not mixed with the probe DNA, so the non-target DNA emits light (for example, red) of the wavelength band of 563 nm.

Meanwhile, in the target DNA mixed with the probe DNA immobilized onto the IGZO surface, a double-spiral DNA molecule (ds DNA) may be formed by hydrogen bonding between base pairs (adenine and thymine/guanine and cytosine), but the non-target DNA is not complementary to the probe DNA, so the ds DNA molecule is prevented from being formed, which make hybridization impossible.

Subsequently, the gate layer is disposed at the lower portion and/or the upper portion of the substrate 10 or the upper portion of the target coupling layer 50.

According to an embodiment of the present disclosure, the disposing of the gate layer may include forming the electrolyte layer 70 at the upper portion of the target coupling layer 50, and disposing the gate layer on the electrolyte layer 70, or may include disposing the gate layer at the lower portion and/or the upper portion of the substrate 10, but is not limited thereto.

In this case, the electrolyte layer 70 may include PBS, potassium chloride (KCl), sodium chloride (NaCl), or potassium bromide (KBr). The potassium chloride (KCl), the sodium chloride (NaCl), or the potassium bromide (KBr) are dissolved in the deionized water, and in this case, the deionized water shows resistance of 3 μS/cm and a pH value of 7.3, and is stirred and used for 1 hour before use.

When the electrolyte layer 70 actually serves as a sensor, the electrolyte layer 70 includes DNA of the virus.

In order to experiment electrical characteristics of the electrolyte thin film transistor manufactured as described above, Metrohm AutoLab Potentiostats/Galvanostats are used. In this case, an area of the channel layer 40 contacting the electrolyte layer 70 is 200×200 $\mu m^2$.

In such a device, activation regions (surfaces directly contacting the electrolyte) of Au and IGZO are 200×200 $\mu m^2$. The TFT device is measured by a Keithley K4200 semiconductor parameter analyzer. All measurements are performed at room temperature.

EXEMPLARY EMBODIMENTS

3-Aminopropyltriehoxysilane (APTES), nitrate indium hydrate, nitrate gallium hydrate, and zinc acetate dehydrate precursor were purchased from Sigma Aldrich, 1× phosphate-buffered saline (PBS) and anhydrous ethanol were purchased from Samjeon Chemicals, PDMS pre-polymer and hardening agent were purchased from Dow Corning, and probe DNA, complementary DNA SARS-CoV-2, non-complementary SARS-CoV DNA, and MERS-CoV DNA were purchased from Bioneer. In this regard, the target DNA means SARS-CoV-2 DNA which is the complementary DNA, and the non-target DNA means SARS-CoV DNA and MERS-CoV DNA which are the non-complementary DNAs.

First, in order to form an IGZO precursor solution, nitrate indium hydrate, nitrate gallium hydrate, and zinc acetate dehydrate were dissolved in 2-methoxyethanol. At this time, the concentration of the IGZO precursor solution was 0.1 M, and indium nitrate hydrate, gallium nitrate hydroxide, and zinc acetate dehydrate were dissolved so that a molar ratio of In:GA:Zn became 0.1:0.15:0.0275. Subsequently, the carbon nano tube was added to a solution in which sulfuric acid and nitric acid were mixed at a volume ratio of 3:1, a polar functional group was generated on the surface of the carbon nano tube through the ultrasound treatment, and the solution was made to hydrophilicity, and then mixed with the metal oxide precursor solution, a precursor solution including the metal oxide precursor and the carbon nano tube was stirred at 60° C. for 4 hours, and filtered through a 0.2 μm hydrophobic polytetrafluoroethylene membrane-based syringe filter, and deposited.

IGZO disclosed below may mean a channel layer including IGZO and the carbon nano tube.

Subsequently, in order to manufacture a sample, a substrate was prepared by thermally oxidizing a silicon dioxide layer having a thickness of 300 nm on an Si wafer doped with boron in a high concentration. Subsequently, through an electron beam deposition method and the photolithography process, 10 nm titanium and 50 nm gold were deposited, and a source electrode and a drain electrode were formed. Subsequently, in order to transform a hydrophobic surface of the Si waver into the hydrophilic surface, oxygen plasma treatment was performed with power of 100 W for 10 minutes, the IGZO precursor solution was spin-coated at a speed of 4000 rpm for 30 seconds, and then annealed at 400° C. for 1.5 hours to form a compacted metal oxide semiconductor layer. That is, an IGZO thin film is patterned through the photolithography and wet etching processes.

Subsequently, in order to prevent device performance deterioration and keep an analysis solution, epoxy-based SU-8 3008 was deposited on the device except for an active site. Subsequently, in order form PDMS well, the pre-polymer and the hardening agent were mixed at a weight ratio of 10:1, and dried for 4 hours in a 60° C. vacuum oven. Subsequently, the PDMS well was manufactured by using a punch hole having a diameter of 8 mm, which was attached to a top of IGZO-EGTFT, and as a result, a detection area of 50.24 $mm^2$ was obtained.

Subsequently, during a biometric functionalization process, the IGZO surface was initially subjected to oxygen plasma treatment with power of 60 W for 1 minute to introduce a hydroxyl group, thereby changing the hydrophobicity of the IGZO surface to hydrophilicity. Subsequently, APTES was dissolved in ethanol having a volume concentration of 15%, and mixed for 3 minutes by using a vortex mixer, and APTES molecules were dispersed to a solvent. Subsequently, the device was soaked in the APTES solution for 17 hours, and then washed with the DI water, and then dried with nitrogen to remove weak bonding, thereby transforming the IGZO surface to an amino functional group ($—NH_2$). In this case, by the amino functional group, covalent bonding of the probe DNA to the IGZO surface was promoted.

Subsequently, in order to immobilize the probe DNA to the transformed IGZO surface, the DNA solution was prepared at a concentration of 5 μM in the DI water, and mixed for 2 minutes by using the vortex mixer until the DNA solution was completely dissolved. Subsequently, a DNA solution of 20 μL was applied to the IGZO surface, and incubated at 60° C. for 3 hours. The surface was washed with the DI water, and dried by using nitrogen gas to remove probe DNA which was not bonded. In this case, the APTES serves as a model for crosslink, and the probe DNA serves as a model for a receptor molecule.

FIG. 6A is a schematic view of a semiconductor-based DNA sensor according to an exemplary embodiment of the present disclosure, and FIG. 6B illustrates a part of FIG. 6A enlarged and photographed.

Referring to FIGS. 6A and 6B, it can be seen that the IGZO channel layer was formed between the source electrode and the drain electrode in an IGZO-based electrolyte-gated thin film transistor (EGTFT).

Further, as a result of rearranging mobile ions by applying positive voltage to the IGZO-EGTFT, EDL capacitance of 6.2 $\mu F/cm^2$ was achieved at 10 kHz, and is higher than capacitance (11.6 $nF/cm^2$) of a thermally oxidized 300 nm $SiO_2$ substrate, so the semiconductor-based DNA sensor easily operates at low voltage due to high capacitance of an electrical double layer (EDL).

Experimental Embodiment 1

A water contact angle was measured in order to estimate surface free energy for pristine IGZO, APTES surface-treated IGZO, IGZO in which the probe DNA was immobilized, and an IGZO surface mixed by target DNA.

FIG. 7 illustrates a surface contact angle of the semiconductor-based DNA sensor according to an exemplary embodiment of the present disclosure.

First, in the pristine IGZO, a contact angle was measured as 51.6°, and surface energy was measured as 59.6 mN/m. Subsequently, a contact angle of oxygen plasma-treated IGZO was 0.8°, but in APTES-deposited IGZO, the contact angle was measured as 68.1°, and the surface energy was reduced to 42.2 mN/m, and the reason is that a self-assembly monolayer was densely formed in a silanol group of IGZO and APTES, and in this case, it can be seen that as the concentration of the APTES solution increases, the contact angle increases, and the surface energy is reduced.

Specifically, when the APTES solution concentrations were 1%, 5%, 10%, and 15%, the contact angles were measured to be 39.1°, 64.8°, 68.1°, and 75.6°, respectively, and the surfaces energies were measured as 70.6 mN/m, 46.3 mN/m, 42.2 mN/m, and 35.2 mN/m. Among them, a concentration which is reliable with a repeatable result was a 10% APTES solution.

Further, the hydrophobicity of the IGZO surface surface-treated by the APTES became strong, and when the probe DNA was immobilized to the IGZO surface, the contact angle increased to 79.1°, and the surface energy was measured as 38.8 mN/m, and in this case, it was identified that covalent bonding between hydrophobic carbon included in the probe DNA and the probe DNA, and APTES of the IGZO was made well.

Further, when the probe DNA and the target DNA (SARS-CoV-2) were mixed, a contact angle of 73.1° and surface energy of 37.3 mN/m were confirmed, and in this case, a hydrophilic surface of the IGZO was enhanced by the hydrophobic carbon of the target DNA mixed with the IGZO surface.

Experimental Embodiment 2

FIG. 8 illustrates a Fourier transform infrared spectrum of the semiconductor-based DNA sensor according to an exemplary embodiment of the present disclosure, and FIG. 9 illustrates a fluorescence result of the semiconductor-based DNA sensor according to an exemplary embodiment of the present disclosure.

As a result of performing ATR-FT-IR analysis in the range of 1500 $cm^{-1}$ to 4000 $cm^{-1}$, when the IGZO was surface-treated with the APTES, a NH transform node peak (1568 $cm^{-1}$) and peaks (2847 $cm^{-1}$ and 2953 $cm^{-1}$) by C—H stretching were confirmed, and this means that the APTES was successfully attached to the IGZO surface. In this case, as the concentration of the APTES increases, the strength of the peak also increases.

Subsequently, when the probe DNA was immobilized, the peak could be confirmed in adenine (1488 $cm^{-1}$), thymine (1645 $cm^{-1}$), guanine (1682 $cm^{-1}$), and cytosine (1715 $cm^{-1}$), and the strength of the peak increased after being mixed with the target DNA. This means that the APTES and the probe DNA were successfully immobilized, and well mixed with the target DNA.

Further, referring to FIGS. 4 and 9, 3' terminal of the probe DNA is labeled with a Cy3 red dye, and 5' terminals of the target DNA and the non-target DNA are labeled with an FAM green dye. When the APTES and the probe DNA are reacted and immobilized on the IGZO surface, red fluorescent emission is confirmed by Cy3 of the probe DNA. In this case, while, even though the probe DNA and the non-target DNA are reacted with each other, the probe DNA and the non-target DNA are not mixed, so a single DNA structure is formed (a lower part of FIG. 9), when the probe DNA and the target DNA are reacted with each other, a double DNA structure is formed by hybridization, so red and green fluorescent emission is confirmed (an upper part of FIG. 9).

Experimental Embodiment 3

FIG. 10A illustrates transfer characteristics of the semiconductor-based DNA sensor according to an exemplary embodiment of the present disclosure, FIG. 10B illustrates output characteristics, and FIGS. 10C to 10E represent histograms for subthreshold swing, transconductance, and threshold voltage, respectively. Specifically, in FIG. 10A, a channel width is 200 μm and a length is 10 μm.

Referring to FIGS. 10A to 10E, subthreshold swing (d VGS/d log IDS) is obtained as 66.085 mV/sec, and this is a value close to a theoretical limit value of MOSFET. Further, gm defined as $\Delta I_{DS}/\Delta V_{GS}$ represents that a voltage amplification degree obtained by using IGZO-EGTFT is according to a gate signal (Ag/AgCl RE), and this means that when the semiconductor-based DNA sensor serves as a biosensor, the semiconductor-based DNA sensor has a high switching speed and sensitivity. A maximum average gm calculated in a switch off situation was measured as 1.005 mS, and this coincides with a result obtained in the previous research.

Experimental Embodiment 4

FIG. 11 illustrates the transfer characteristics of the semiconductor-based DNA sensor according to an exemplary embodiment of the present disclosure, and FIG. 12A illustrates the selectivity of the semiconductor-based DNA sensor according to an exemplary embodiment of the present disclosure, and FIG. 12B illustrates the reactivity of the semiconductor-based DNA sensor. Specifically, FIG. 11 illustrates transfer characteristics of pristine IGZO (IGZO), APTES-treated IGZO (APTES), IGZO to which the probe DNA is immobilized (probe DNA), and IGZO mixed with SARS-CoV-2 DNA which is the target DNA (SARS-CoV-2 DNA).

In IGZO hydrated by oxygen plasma, positive charges appear on the surface, but when the APTES is covalently bonded to the hydrated IGZO surface, drain current is reduced by the APTES deposited on the IGZO surface. In this case, when the APTES solution is 10%, preferably 18, if a value of $V_{TH}$ is increased or APTES treatment is conducted by a silane reaction, an available reaction part of the IGZO surface is reduced, that is, an IGZO amine group density is saturated in the case of APTES 10%.

Further, when the APTES concentration is less than 10%, preferably 18, a single layer generated on the IGZO surface becomes unstable, so an adhesive force for immobilizing the probe DNA becomes weak, and when an APTES solution which is more than 10% is used, the silane molecule forms a multilayer or aggregation on the IGZO surface to undermine stability and homogeneity of IGZO surface deformation, which may interfere with immobilization of the probe DNA.

Meanwhile, it was confirmed that the concentration and a reaction time of the probe DNA influences the hybridization with the target DNA. Specifically, it was confirmed that when the concentration of the probe DNA increases, normalized response (NR) is reduced, and saturation is reached in 5 μM, and it was confirmed that when a immobilization time is extended from 1 hour to 3 hours, an NR value is changed, but when the concentration is immobilized for 3 hours or more, there is no change in NR.

In this case, NR may be represented as $|I_d - I_o|/I_o$ ($I_o$ and $I_d$ are drain currents before or after reaction of IGZO-EGTFT (APTES surface treatment, probe DNA immobilization, or target DNA hybridization), respectively).

The hybridization of the target DNA moves $V_{TH}$ in a positive direction, and this occurs by potential drop between the IGZO surface and the electrolyte due to a relatively large negative charge of a phosphate backbone of the IGZO surface DNA.

Meanwhile, in order to validate selectivity for the target DNA, an NR accumulation probability was evaluated. Referring 12A, the target DNA is statistically dramatically reduced in NR ($\Delta I/I_o = -0.685$), while the non-target DNA (SARS-CoV and MERS CoV) showed a constant reaction in a saturation region, and this means that the IGZO-based DNA sensor has strong selectivity for the target DNA.

Further, referring to FIG. 12B, it was confirmed that the IGZO-EGTFT shows an excellent linear reaction for the target DNA (SARS-CoV-2), and has a high correlation coefficient $R^2$ of 0.9965 and a detection range of 50 fM to 5 μM (a detection limit: 50 fM).

Experimental Embodiment 5

In order to confirm whether the sensitivity is maintained after repeated use, the hydroxyl group was regenerated by removing the APTES and the DNA without removing a converter on the IGZO surface.

FIGS. 13A and 13B illustrate a test of repeatability of the semiconductor-based DNA sensor according to an exemplary embodiment of the present disclosure.

Referring to FIGS. 13A and 13B, even though 4-cycle biopsy functioning task and a removal process are performed, the semiconductor-based DNA sensor according to the present disclosure maintains sensitivity and linear reactivity for the target DNA, which means that recyclability is excellent. Further, even though the NR was measured throughout a repetition cycle based on a one-way analysis of a variance test, a statistically meaningful difference was not confirmed, and it was confirmed that p is larger than 0.05, and it may be confirmed that the NR maintains a consistent sensitivity as −0.014.

Experimental Embodiment 6

FIG. 14 is a graph illustrating a current change of the semiconductor-based DNA sensor according to an exemplary embodiment of the present disclosure. Referring to FIG. 14, when CNT is applied onto the IGZO surface, a current change by the probe DNA is relatively large, and an absolute value of the NR is measured to be large, and this means that using the carbon nano tube jointly is more excellent than using pristine IGZO as the channel layer. Further, when the target DNA is bonded to the semiconductor-based sensor, the increase of the current change may be expected.

FIG. 15 is a graph for measuring a sensitivity of the semiconductor-based DNA sensor according to an exemplary embodiment of the present disclosure.

For measurement of the sensitivity of the semiconductor-based sensor, as a result of confirming limit of detection according to the concentration of the target DNA, it was confirmed that a lower limit of a concentration measurable in a sensor without CNT was 50 fM, but up to at least 500 aM (0.5 fM) was measurable in a sensor with the CNT.

The aforementioned description of the present disclosure is used for exemplification, and it can be understood by those skilled in the art that the present disclosure can be easily modified in other detailed forms without changing the technical spirit or requisite features of the present disclosure. Therefore, it should be appreciated that the aforementioned exemplary embodiments are illustrative in all aspects and are not restricted. For example, respective constituent elements described as single types can be distributed and implemented, and similarly, constituent elements described to be distributed can also be implemented in a coupled form.

The scope of the present disclosure is represented by claims to be described below rather than the detailed description, and it is to be interpreted that the meaning and scope of the claims and all the changes or modified forms derived from the equivalents thereof come within the scope of the present disclosure.

What is claimed is:

1. A semiconductor-based DNA sensor comprising:

a first electrode and a second electrode disposed on a substrate to be spaced apart from each other;

a channel layer disposed between the first electrode and the second electrode;

a target coupling layer disposed on the channel layer, and including probe DNA detecting target DNA through a hybridization reaction;

a passivation layer selectively exposing an upper portion of the target coupling layer; and a gate layer disposed at a lower portion of the substrate, or the upper portion of the target coupling layer, wherein the channel layer includes a metal oxide and a carbon nanotube.

2. The semiconductor-based DNA sensor of claim 1, wherein the metal oxide includes indium, gallium, and zinc.

3. The semiconductor-based DNA sensor of claim 2, wherein the metal oxide includes In—Ga—Zn oxide.

4. The semiconductor-based DNA sensor of claim 1, wherein the target coupling layer includes 3-aminopropyltriethoxysilane (APTES) and the probe DNA, and includes covalent bonding between an amino group of the APTES and phosphate group of the probe DNA.

5. The semiconductor-based DNA sensor of claim 1, wherein each of the first electrode and the second electrode is independently selected from the group consisting of Au, Zr, Ti, Fe, Ni, Cr, and combinations thereof.

6. The semiconductor-based DNA sensor of claim 1, further comprising:

an electrolyte layer disposed at the upper portion of the target coupling layer.

7. The semiconductor-based DNA sensor of claim 6, wherein the gate layer is disposed on the electrolyte layer, or disposed at the lower portion of the substrate.

8. The semiconductor-based DNA sensor of claim 6, wherein the electrolyte layer includes a layer selected from the group consisting of phosphate-buffered saline (PBS), NaCl, KCl, KBr, and combinations thereof.

9. A manufacturing method of a semiconductor-based DNA sensor, comprising:

disposing a first electrode and a second electrode on a substrate to be spaced apart from each other;

forming a channel layer between the first electrode and the second electrode;

forming a passivation layer on the first electrode and the second electrode;

forming a target coupling layer capable of detecting target DNA on the channel layer; and disposing a gate layer at a lower portion of the substrate, or an upper portion of the target coupling layer, wherein the channel layer includes a metal oxide and a carbon nanotube.

10. The manufacturing method of a semiconductor-based DNA sensor of claim 9, wherein the forming of the channel layer includes applying a solution including a metal oxide precursor and the carbon nanotube, and curing the solution.

11. The manufacturing method of a semiconductor-based DNA sensor of claim 10, wherein the metal oxide precursor includes nitrate indium hydrate ($In(NO_3)_3 \cdot x(H_2O)$), nitrate gallium hydrate ($Ga(NO_3)_3 \cdot x(H_2O)$), and zinc acetate dihydrate ($Zn(CH_3COO)_2 \cdot 2(H_2O)$).

12. The manufacturing method of a semiconductor-based DNA sensor of claim 9, wherein the forming of the target coupling layer include hydrophilically treating an upper portion of the channel layer, applying amino silane to the upper portion of the channel layer, and forming mutual covalent bonding by silanization-reacting phosphate of probe DNA and the amino silane.

13. The manufacturing method of a semiconductor-based DNA sensor of claim 9, wherein the disposing of the gate layer includes forming an electrolyte layer at the upper portion of the target coupling layer, and disposing the gate layer on the electrolyte layer, or includes disposing the gate layer at the lower portion of the substrate.

* * * * *